United States Patent [19]

Hakata et al.

[11] Patent Number: 4,710,770
[45] Date of Patent: Dec. 1, 1987

[54] PHASE MODULATION TYPE DIGITAL POSITION DETECTOR

[75] Inventors: Yoshitami Hakata; Masanori Wakuda; Kimio Suzuki, all of Numazu, Japan

[73] Assignee: Toshiba Kikai Kabushiki Kaisha, Tokyo, Japan

[21] Appl. No.: 592,296

[22] Filed: Mar. 22, 1984

[30] Foreign Application Priority Data

Mar. 24, 1983 [JP] Japan .................................. 58-49283
Dec. 22, 1983 [JP] Japan ................................. 58-242859

[51] Int. Cl.⁴ ............................................ G08C 19/12
[52] U.S. Cl. ............................ 340/870.18; 340/870.34
[58] Field of Search ...................... 340/870.18, 870.21, 340/870.25, 870.23, 870.34; 364/559; 318/605

[56] References Cited

U.S. PATENT DOCUMENTS 3,667,031 5/1972 Cox, Jr. et al. ............ 340/870.34 X
4,472,669 9/1984 Denham et al. ........... 340/870.34 X

FOREIGN PATENT DOCUMENTS 786990 of 1968 Canada .

Primary Examiner—Jerry W. Myracle
Attorney, Agent, or Firm—Cushman, Darby & Cushman

[57] ABSTRACT

A digital mode phase modulation type position detector utilizing a resolver as the phase modulating element is disclosed in which the phase of the modulated signal is determined by comparing it with that of the follower signal, the phase of which is adjusted to that of the modulated signal. The phase difference between the modulated and the follower signal is detected at the ends of the half-periods thereof to effect the adjustment. To make the adjustment more precise, an adjustment circuit may further be provided which generates evenly spaced pulses in the present half-period of the follower signal at a frequency corresponding to the rotational speed of the resolver during the preceding half-period of the modulated signal. These pulses are used to adjust the phase of the follower signal more closely to that of the modulated signal. The position counter is also provided to accumulate the values corresponding to the phase differences between the modulated and the follower signal and/or the number of the pulses of the adjustment circuit. Thus, the accumulated value in the position counter represents the overall rotational angle of the resolver from the beginning of the counting up to the present instant.

56 Claims, 18 Drawing Figures

PHASE MODULATION TYPE DIGITAL POSITION DETECTOR

BACKGROUND OF THE INVENTION

The present invention relates to position detectors, and more particularly to digital position detectors, such as resolvers, which are capable of determining the position of an object by means of an electrical signal the phase of which is varied in proportion to the rotational angle of a detector shaft which is mechanically coupled to the object under measurement.

There are a great number of industrial applications in which precise measurements of the positions of objects are of paramount importance. Automatically controlled machines are typical examples, because the positions of the moving elements thereof must first be determined precisely in order that the moving parts of the machines be controlled and moved to the predetermined position. In the case of industrial robots or numerically controlled machine tools, for example, the rotational angles of the driving shafts which are mechanically coupled to the elements to be moved are measured to determine the positions of the elements.

Among the most common position detectors that are capable of determining the position of an object through the angle of rotation of the detector shaft coupled to the object the position of which is to be measured are those which utilize the phase modulation method. According to this method, the phase of an electrical signal is modulated in proportion to the angle of rotation of the detector shaft, and the determination of the rotational angle of the shaft is effected by measuring the phase angle of the electrical signal. A typical example of such position detectors utilizing the phase modulation method is the resolver.

The operational principle of a typical conventional resolver which measures the rotational angle of the detector shaft in the digital mode is as follows. The clock pulses generated by a clock are counted by a counter which counts, for example, up to 1000. The stator windings of the resolver are excited in precise synchronization with the content of the counter so that a magnetic field is generated which rotates in exact synchronization with the counter content and completes one rotation every time the counter counts to up to 1000. Thus, a sinusoidally varying electrical signal is generated in the rotor winding wound around a rotor. As the rotor is fixedly mounted on the detector shaft which is rotated, the phase angle of the electrical signal thus generated corresponds to the rotational angle to be measured.

The sinusoidal electrical signal generated in the rotor of the resolver is further processed to adapt the signal to digital mode operation by a wave shaper circuit to produce a square or rectangular pulse signal which takes the logical value 1 or 0 depending on whether the sinusoidal electrical signal is positive or otherwise. Thus, the length of time between the time point at which the counter takes the value 0 and the time point of the rising edge of the rectangular pulse signal corresponds to the phase angle of the sinusoidal electrical signal, and thus corresponds to the rotational angle of the detector shaft at the point of time at which the rising edge of the rectangular pulse signal occurs. Because this length of time, as measured by the aforementioned clock pulses, is equal to the number stored in the aforementioned counter at the time of the rising edge of the rectangular pulse signal, the content of the counter is transferred to a phase angle register every time the rising edge of the rectangular pulse signal occurs. Thus, the numerical value stored in the phase angle register represents the digital angle of rotation of the detector shaft measured digitally to one thousandth of a revolution.

The central processing unit reads out the numerical value stored in the phase angle register at fixed sampling periods, and calculates the overall angle by which the detector shaft has rotated from the beginning up to the present sampling time by means of the sampled values of the phase angles.

In the case of the resolver as described above, however, if the numerical value stored in the phase angle register changes by an amount greater than 500, i.e. one half revolution, during the time interval between the two successive sampling times, the central processing unit cannot determine whether the shaft has rotated forward or backward during the same interval. Thus, the determination of the overall angle of rotation of the detector shaft from the beginning up to the present, or, what amounts to the same thing, the determination of the position of the element coupled to the detector shaft, becomes impossible when the detector shaft rotates by an angle exceeding one half a revolution during the time interval between the two successive sampling times.

Further, the numerical value read out from the phase angle register at the sampling time corresponds to the rotational angle of the shaft at the time at which the preceding rising edge of the aforementioned rectangular pulse signal occurs, and thus does not represent the rotational angle which is taken by the shaft at the sampling time. The existence of this time lag between the sampling and the measurement time is also an obstacle to the precise determination of the position of the element coupled to the detector shaft.

SUMMARY OF THE INVENTION

Thus, an object of the present invention is to provide a position detector utilizing the phase modulation method which is capable of precise determination of the position of an object.

Another object of the present invention is to provide such a detector operating in the digital mode.

A further object of the present invention is to provide such a detector which is capable of detecting the position of an object irrespective of the speed of the movement thereof.

A still further object of the present invention is to provide such a detector which is capable of a precise determination of the position of an object at arbitrarily chosen instants.

Thus, the device according to the present invention comprises a phase modulation circuit which modulates the phase of an electrical signal in accordance with the variation of a physical quantity to be measured, such as the position of an object under measurement, thereby generating the phase-modulated or the first signal. The device according to the present invention comprises further a follower signal generation circuit which generates the second or the phase follower signal the phase of which follows that of the first signal, a phase difference detector circuit which compares the phases of the first and the second signal to generate the third signal corresponding to the time intervals during which a phase difference exists between the first and the second signal, and a storage device which stores the third signal in accumulation, i.e., stores the summation of the amounts corresponding to the third signals. The degree by which the phase of the second signal follows that of the first signal is controlled by the follower signal generation circuit in response to the third signal.

According to a preferred aspect of the present invention, an adjustment circuit is also provided which stores the third signal in accumulation and generates the fourth signal at substantially equal spacings on the basis of the accumulated value of the third signal, within the time period which is determined in accordance with the period or half-period of the first or the second signal. According to this aspect of the present invention, the storage device corresponding to that as described above stores the values of the fourth signal in accumulation, preferably in addition to those of the third signal, and the degree by which the second signal follows the first is controlled by the follower signal generation circuit in response to the fourth signal supplied thereto from the adjustment circuit.

BRIEF DESCRIPTION OF THE DRAWINGS

Details of the structure and the principle of the present invention, together with further objects and advantages thereof, will become more apparent from the following detailed description of the preferred embodiments taken in conjunction with the accompanying drawings, in which.

DETAILED DESCRIPTION OF THE PREFERRED EMBODIMENTS

Before describing the preferred embodiments of the present invention, the operational principle of a typical digital position detector utilizing a resolver will be explained.

Figure 1:
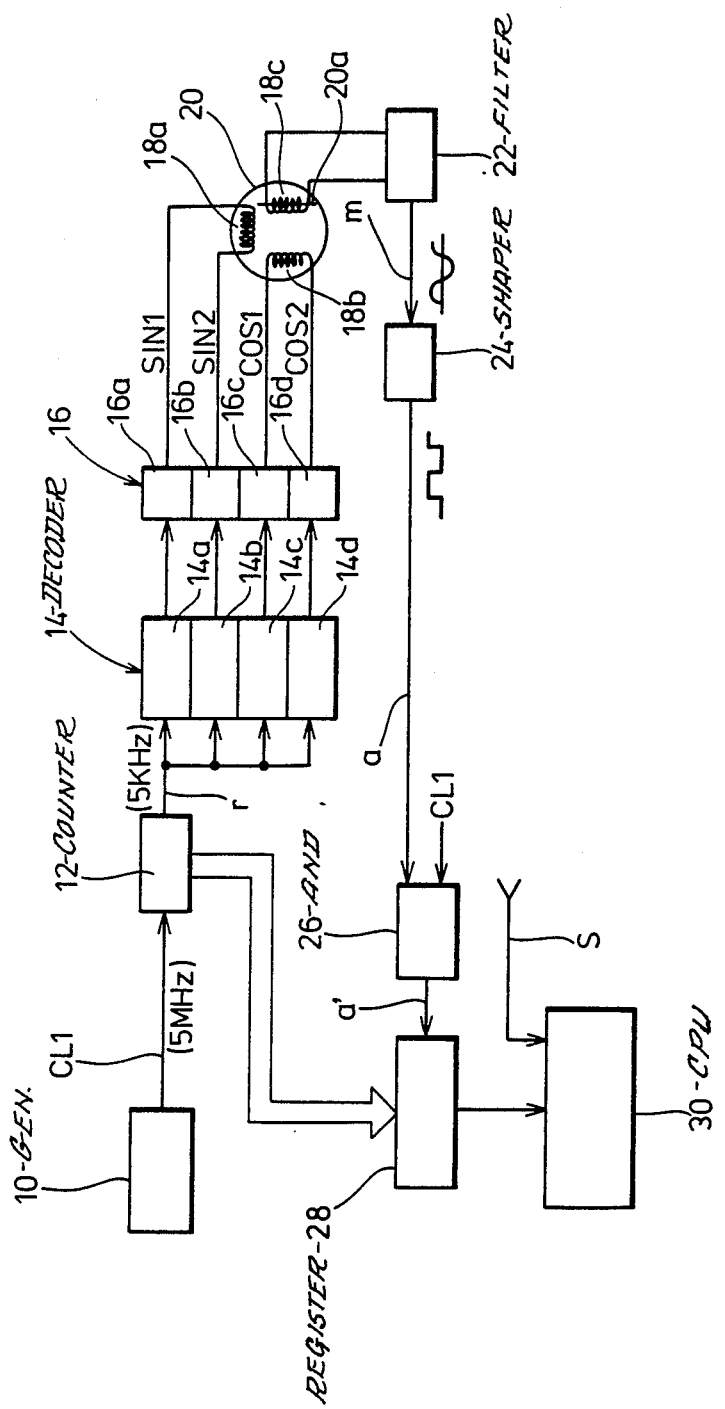
FIG. 1 is a block diagram of a typical digital position detector utilizing a resolver.

FIG. 1 is a block diagram of the main parts of such a detector. A clock pulse signal CL 1 of 5 MHz with a duty factor of 50% is generated in the clock pulse generator 10 and is supplied to a modulo 1000 counter 12, which divides the frequency of the clock pulse signal supplied thereto by a factor of 1000 to produce a reference signal r of 5 kHz. More precisely, the reference signal r corresponds to the content of the counter 12 which counts the clock pulses CL 1 up to 999 and then returns to 0. A decoder circuit 14 comprising the four portions 14a through 14d, supplies in sequence a logical output 1 from a portion 14a 14b, 14c, or 14d to a corresponding portion 16a, 16b, 16c or 16d of the magnetic excitation circuit 16 as the the counter 12 takes the value 0 through 249, 250 through 499, 500 through 749, or 750 through 999, respectively.

The excitation circuit 16 energizes the sine and cosine stator windings 18a and 18b of the resolver 20 through the lines SIN 1 and SIN 2 and COS 1 and COS 2, respectively, in response to the logical 1 output from a portion 14a, 14b, 14c, or 14d supplied to a portion 16a, 16b, 16c, or 16d thereof. Thus, a magnetic field rotating in precise synchronization with the content of the counter 12 or the reference signal r is generated by the stator windings 18a and 18b.

The rotor winding 18c is fixedly secured to the rotor 20a of the resolver 20, which is mechanically coupled to the object under measurement, e.g., a table of a machine tool which is mechanically coupled to the resolver through a feed gear system. Thus, the rotor 20a, and therefore the rotor winding 18c is rotated by an angle $\theta$ corresponding to the position of the object to be measured. As a result, a sinusoidally varying voltage is developed in the rotor winding 18c, the phase angle of which corresponds to the rotational angle $\theta$ of the rotor 20a of the resolver 20. This voltage developed in the rotor winding 18c is supplied to the filter circuit 22 and is formed into the phase-modulated electrical signal m having the form of a sine wave with a phase angle corresponding to the rotational angle $\theta$ of the rotor 20a of the resolver 20. Thus, the modulated signal m can be expressed in the form $m = K \sin(\omega t + \theta)$, wherein K is a constant, $\omega$ is the angular velocity of the rotating magnetic field generated by the stator windings 18a and 18b, and θ is the angle of rotation of the rotor 20a with respect to the reference angular position thereof.

The modulated signal m is further supplied to the waveform shaper circuit 24 and is processed into a rectangular wave a which takes the logical value 1 or 0 depending on whether the signal m is positive or otherwise. Thus, the signal a has the same frequency, 5 kHz, as the aforementioned reference signal r and the phase difference therebetween corresponds to the rotational angle θ of the rotor 20a of the resolver 20 as shown in FIG. 2, in which the reference signal r is represented as a square or rectangular pulse signal of 5 kHz.

The AND gate 26 is supplied with the signal a and the clock pulse signal CL 1 and outputs a transfer command signal a' when the first clock pulse CL 1 occurs after the rising edge of the signal a, i.e., after the signal a changes the logical value thereof from 0 to 1. Upon receiving the transfer command signal a' from the gate 26, the phase angle register 28 reads out the content of the modulo 1000 counter 12, which is stored in the register 28 until the next transfer command signal is supplied thereto, whereupon a new or updated content of the counter 12 is read out and stored therein.

Figure 2:
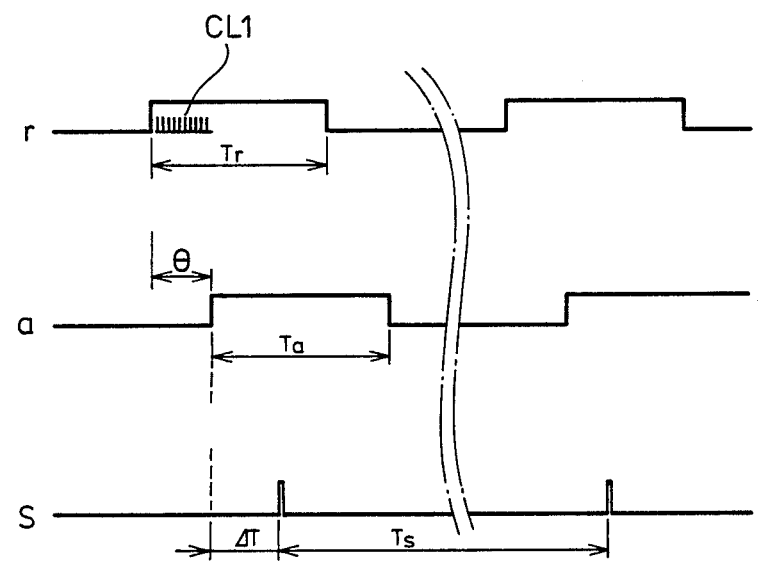
FIG. 2 shows the wave-forms of the principal signals generated in the detector of FIG. 1.

The computer 30 reads out the content of the register 28 when a sampling command signal s is supplied thereto at a sampling period Ts which is usually substantially longer than the periods 2Tr and 2Ta of the signals r and a as shown in FIG. 2 wherein half-periods Tr and Ts of the signals r and s are shown instead of the full periods 2Tr and 2Ta. This numerical value read out from the register 28 upon receiving the sampling command signal s is used as the information corresponding to the rotational angle θ of the rotor 20a of the resolver 20 at the moment of the occurrence of the sampling signal s. Thus, if the rotor 20a of the resolver 20 is coupled to a table of a machine tool through, for example, a feed gear system, the computer 30 can calculate and determine the distance of the movement of the table of the machine tool in the direction corresponding to the rotation of the resolver 20.

It has been pointed out, however, that the position detector as described above has two disadvantages. One is that, as the maximum value which can be stored in the register 28 is the same as that of the counter 12, the computer 30 cannot follow a rotation of the rotor 20a of the resolver 20 which exceeds the angle corresponding to 500 pulses of the clock pulse signal CL 1 during one sampling period Ts. That is, the computer 30 cannot judge whether the rotor 20a of the resolver 20 has rotated forward or backward, or rather, whether it has rotated by an angle exceeding one rotation or not. Thus, if the rotor 20a of the resolver 20 rotates by an angle corresponding to 500 pulses of the clock pulse signal CL 1 during one sampling period Ts, the position of the table coupled to the rotor of the resolver 20 as determined by the computer 30 is subject to errors amounting to one rotation of the rotor 20a of the resolver 20. Thus, the computer 30 loses trace of the object under measurement. Let us take the case as an example wherein the table coupled to the rotor of the resolver 20 moves 1 micron in the X direction as the rotor of the resolver 20 rotates by an angle corresponding to one pulse spacing or period of the clock pulse CL 1, and the sampling period is fixed at 2 milliseconds. In this case, the computer 30 becomes incapable of position determination if the table coupled to the rotor 20a of the resolver 20 is translated in the X direction at a speed exceeding 500 microns per millisecond, which is calculated to be approximately equal to 1.5 meters per minute, a speed which may not be as rare as it is hoped.

Another disadvantage of the position detector as described above is that there exists a certain time lag ΔT, between the moment of the generation of a sampling pulse s and the moment at which the transfer command signal a' immediately preceding the sampling pulse s is supplied to the register 28 and the content thereof updated. Thus, the numerical value read out from the register 28 does not correspond to the rotational angle of the rotor 20a of the resolver 20 at the instant of the generation of the sampling pulse s.

These disadvantages can be overcome by the present invention, the preferred embodiments of which are now described referring to FIGS. 3 through 18 of the drawings.

Figure 3:
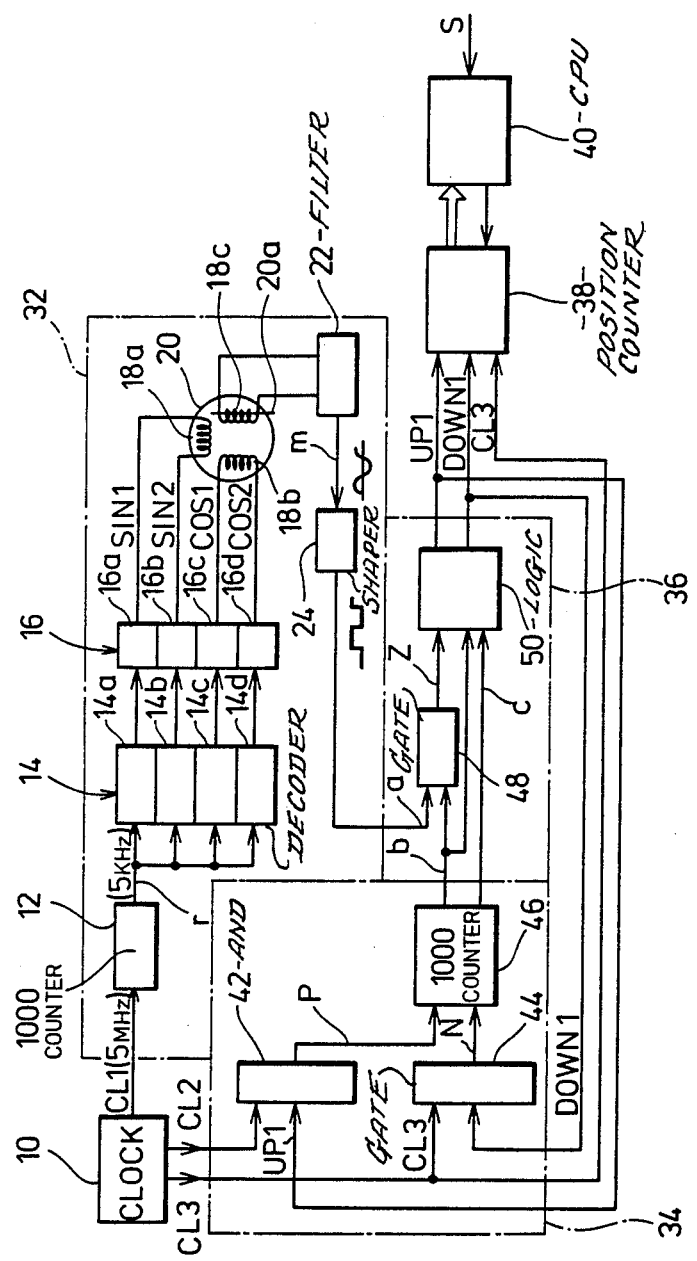
FIG. 3 is a block diagram of a digital position detector of the phase modulation type according to the present invention.

FIG. 3 is a block diagram of a first embodiment of the present invention. The position detector shown in the figure comprises in the main a clock pulse generator circuit 10, a phase modulation circuit 32, a phase follower signal generating circuit 34, a phase difference detector circuit 36, an accumulation counter 38, and a CPU 40.

Figure 4:
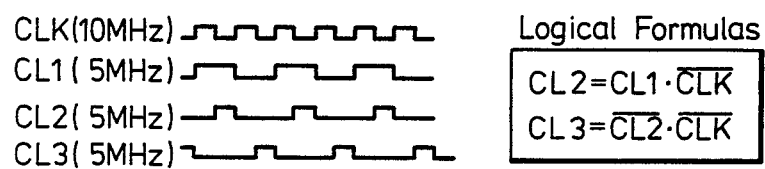
FIG. 4 shows the wave-forms of the clock signals generated by the clock pulse generator circuit in the detectors of FIG. 3 and FIG. 8.

The clock pulse generator circuit 10 comprises a clock (not shown) which generates a clock pulse train CLK having a duty factor of 50% at a rate of 10 MHz as shown in FIG. 4. The clock pulses CLK are supplied to a flip-flop (not shown) in the circuit 10, by means of which a clock pulse CL 1 of 5 MHz with a duty factor of 50% is generated. The circuit 10 further comprises inverters and AND gates (not shown) through which the clock pulses CLK and CL 1 are converted into further clock pulse signals CL 2 and CL 3 expressed by the following logical formulas:

$$CL\ 2 = CL\ 1 \cdot \overline{CLK}$$

$$CL\ 3 = \overline{CL\ 2} \cdot CLK.$$

Clock pulse sigals CL 2 and Cl 3 are pulse train signals in antiphase having the duty factor 25% and pulse rate or frequency of 5 MHz, as shown in FIG. 4. The clock pulse signal CL 1 is supplied to the phase modulation circuit 32 while the clock pulse signals CL 2 and CL 3 are supplied to the phase follower signal generator circuit 34. The clock pulse signal CL 3 is also supplied to the accumulation counter 38.

The phase modulation circuit 32 is essentially the same as the corresponding circuit shown in FIG. 1 which comprises the elements 12 through 24. Thus, a clock pulse signal CL 1 of 5 MHz with a duty factor of 50% generated in the clock pulse generator 10 is supplied to a modulo 1000 reference counter 12, which divides the frequency of the clock pulse signal supplied thereto by a factor of 1000 to produce a reference signal r of 5 kHz. More precisely, the reference signal r corresponds to the content of the counter 12 which counts the clock pulses CL 1 up to 999 and then returns to 0 to resume the counting anew. A decoder circuit 14 comprising the four portions 14a through 14d supplies in sequence a logical output 1 from a corresponding portion 14a, 14b, 14c, or 14d to a portion 16a, 16b, 16c or 16d of the magnetic excitation circuit 16 as the the counter 12 takes the value 0 through 249, 250 through 499, 500 through 749, or 750 through 999, respectively.

The excitation circuit 16 energizes the sine and cosine stator windings 18a and 18b of the resolver 20 through the lines SIN 1 and SIN 2 and COS 1 and COS 2, respectively, in response to the output of logical 1 from a portion 14a, 14b, 14c, or 14d supplied to a portion 16a, 16b, 16c, or 16d thereof. Thus, a magnetic field rotating in precise synchronization with the content of the counter 12 or the reference signal r is generated by the stator windings 18a and 18b.

The rotor winding 18c is fixedly secured to the rotor 20a of the resolver 20, which is mechanically coupled to the object the position of which is to be measured, e.g., a table of a machine tool mechanically coupled to the resolver 20 through a feed gear system. Thus, the rotor 20a, and therefore the rotor winding 18c is rotated by an angle $\theta$ corresponding to the position of the object to be measured. As a result, a sinusoidally varying voltage is developed in the rotor winding 18c, the phase angle of which corresponds to the rotational angle $\theta$ of the rotor 20a of the resolver 20. This voltage developed across the rotor winding 18c is supplied to the filter 22 and is formed into the phase-modulated electrical signal m having the form of a sine wave with a phase angle corresponding to the rotational angle $\theta$ of the rotor 20a of the resolver 20. Thus, the modulated signal m can be expressed in the form $m = K \sin(\omega t + \theta)$, wherein K is a constant, $\omega$ is the angular velocity of the rotating magnetic field generated by the stator windings 18a and 18b and $\theta$ is the angle of rotation of the rotor winding 18c with respect to the reference angular position thereof.

The modulated signal m is further supplied to the waveform shaper circuit 24 and is processed into a rectangular wave a which takes the logical value 1 or 0 depending on whether the signal m is positive or otherwise. Thus, the signal a has the same frequency, 5 kHz, as the aforementioned reference signal r when the rotor 20a of the resolver 20 is at rest. The frequency of the phase-modulated pulse signal a increases as the rotor 20a of the resolver 20 rotates in the direction opposite to that of the rotation of the magnetic field produced by the stator windings 18a and 18b, and decreases as the rotor 20a rotates in the same direction as the magnetic field produced by the stator windings 18a and 18b. The increase or decrease in the half-period Ta of the signal a corresponds to the increment or decrement in the angle of rotation of the rotor 20a during the same half-period Ta. Thus, the duty factor of the signal a is 50% when the rotor 20a is rotating at a constant speed.

The phase follower signal generator circuit 34 which generates a phase follower signal b described hereinbelow comprises a first and a second gate circuit 42 and 44 and a follower counter 46.

The first AND gate 42 is supplied with the clock pulse signal CL 2 from the clock pulse generator 10 and a signal UP 1 from the phase difference detector circuit 36, which takes the logical value 1 during the time interval during which the signals a and b have different values, provided that the phase of the signal a leads that of the follower signal b. Otherwise, the signal UP 1 remains at the logical 0 level.

The second gate circuit 44 is supplied with the clock pulse signal CL 3 from the clock pulse generator 10 and a signal DOWN 1 from the phase difference detector circuit 36, which takes the logical value 1 during the time interval during which the signals a and b take different values, provided, however, that the phase of the signal a lags behind that of the signal b. The signals UP 1 and DOWN 1 will be described in more detail hereinbelow in conjunction with the description of the phase difference detector circuit 36.

The first gate 42 consists of an AND gate which effects an AND operation on the signals CL 2 and UP 1 to generate a signal P defined by the following equation:

$$P = CL\ 2 \cdot UP\ 1.$$

Thus, the signal P outputted by the first gate circuit 42 is identical with the clock pulse signal CL 2 when the signal UP 1 is generated, i.e., at the logical level 1, but otherwise remains at the level 0. Hence, the signal P is generated only when the phase of the modulated signal a leads that of the follower signal b, the number of pulses contained in the signal P corresponding to the phase difference between the signals a and b.

The second gate circuit 44 consists of an inverter and and AND gate, and effects the following logical operation on the signals CL 3 and DOWN 1 to generate an output signal N:

$$N = CL\ 3 \cdot \overline{DOWN\ 1}$$

Thus, the output signal N of the second gate circuit 44 is identical with the clock pulse signal CL 3 unless the signal DOWN 1 is generated, i.e., at the logical 1 level, in which case the passage of the clock pulses of the signal CL 3 is suppressed by the second gate circuit 44 and the output signal N thereof is held at the 0 level.

The follower counter 46 consists of a modulo 1000 counter, which counts the number of pulses supplied at the outputs P and N of the first and the second gate circuits 42 and 44 up to 999 and then returns to 0 to resume the counting. Thus, the content of the counter 46 increases twice as fast as usual when the signal UP 1 is present, for, during that time, the signal P, which is identical with the clock pulses CL 2, is supplied thereto in addition to the signal N which is identical with the clock pulses CL 3. When the signal DOWN 1 is generated, on the other hand, the increase of the content of the counter 46 is suppressed, for, during that time, the second gate circuit 44 inhibits the passage of the clock pulses CL 3 and the signal N is retained at the 0 level.

The counter 46 generates the phase follower signal b which corresponds to the content thereof. More specifically, the follower signal b takes the logical value 1 when the content of the counter 46 is from 0 to 499, while it is held at the 0 level when the counter content is from 500 to 999. Thus, the half-period Tb of the signal b is equal to that Tr of the reference signal r generated by the reference counter 12 when neither the signal UP 1 nor DOWN 1 is generated, i.e., if the signal b is in phase with the output signal a of the phase modulation circuit 32. When the phase of the signal a leads that of the follower signal b, the half-period Tb thereof is shortened by a value corresponding to the phase difference therebetween due to the presence of the signal UP 1. When, on the other hand, the phase of the signal a lags behind that of the signal b, the half-period Tb is lengthened by a value corresponding to the phase difference therebetween due to the presence of the signal DOWN 1. The increase or decrease in the length of the half period Tb of the follower signal b is equal to the length of the time interval during which the signal UP 1 or DOWN 1 is generated, i.e., at the logical 1 level.

The counter 46 further generates a period signal c having a half-period Tc which is equal to the half-period Tb of the signal b. The second output signal c of the counter 46, however, is in quadrature with the signal b, the phase thereof leading that of b by 90°.

The phase difference detector circuit 36 comprises exclusive OR element 48 and a logical circuit 50. The exclusive OR element 48 is supplied with the signals a and b from the phase modulation circuit 32 and the follower counter 46 of the phase follower signal generation circuit 34, respectively, and effects the exclusive OR operation thereon to produce the output signal Z given by the following equation:

$$Z = a \oplus b$$

Thus, the signal Z takes the logical value 1 during the time interval during which the values of the signals a and b are different from each other, but otherwise remains at the logical level 0.

The logical circuit 50 receives the signals b, c, and Z, and determines whether or not the signal a leads the signal b in the phase thereof, generating and generates the output signal UP 1 which is identical with the signal Z when the phase of the signal a leads that of the signal b. When the phase of the signal a lags behind that of the signal b, on the other hand, the circuit 50 generates the output signal DOWN 1 which is equal to the signal Z. These output signals of the circuit 50 can be expressed in logical formulas as follows:

$$UP\ 1 = Z(\overline{bc} + \overline{b}c)$$

$$DOWN\ 1 = Z(\overline{bc} + bc)$$

The right hand sides of these equations can directly be expressed by the signals a, b, and c as follows:

$$UP\ 1 = a\overline{b}c + \overline{a}b\overline{c}$$

$$DOWN\ 1 = \overline{a}bc + a\overline{b}\overline{c}$$

Thus, it would be easy for those skilled in the art to design other logical circuits which effect the same function as that of the phase detector circuit 36 on the basis of the above expressions of the output signals UP 1 and DOWN 1 thereof.

The position counter 38 is supplied with the outputs UP 1 and DOWN 1 from the phase difference detection circuit 36, and the clock pulse signal CL 3 from the clock pulse generator circuit 10. The counter 38 comprises a reversible counter having a considerably larger counting range, e.g. from −10000 to +10000, than those of the reference and the follower counter 12 and 46. The reversible counter 38 counts the number of pulses of the clock signal CL 3 applied thereon only when either the signals UP 1 or DOWN 1 is at the logical 1 level. When the signal UP 1 is supplied, the number of the pulses of the clock signal CL 3 is counted as a positive value, i.e., the content of the reversible counter increases by the same number. When the signal DOWN 1 is supplied, on the other hand, the number of the pulses contained in the signal CL 3 is counted as a negative value, i.e., the content of the reversible counter is decreased by the same number.

As described hereinbelow in more detail, the length of the time interval during which the signals UP 1 and DOWN 1 are generated is proportional to the angle of rotation of the rotor 20a of the resolver 20 in each preceding half period Ta of the output signal a of the phase modulation circuit 32. More specifically, the length of the duration of the signal UP 1 corresponds to the clockwise rotational angle of the rotor 20a of the resolver 20, assuming that the magnetic field generated by the stator windings 18a and 18b rotates anti-clockwise. The length of the duration of the signal DOWN 1, on the other hand, corresponds to the anticlockwise rotational angle of the rotor 20a of the resolver 20. Thus, the number stored in the reversible counter 38 corresponds to the angle by which the rotor 20a of the resolver 20 has rotated from the beginning of the counting up to the present.

The computer 40 responds to the sampling signal s supplied at a sampling period Ts, and reads out the numerical value stored in the position counter 38 at the instant at which the sampling signal s is supplied thereto. The computer 40 can thus calculate, for example, the rotational angle travelled by the rotor 20a of the resolver 20 during the time interval between the two successive sampling signals s, i.e., during each sampling period Ts, or the average rotational speed thereof during the same period. The sampling period Ts can be chosen at any desired value, but is usually fixed at a value substantially longer than that of the half-period Tr of the reference signal r.

Figure 5:
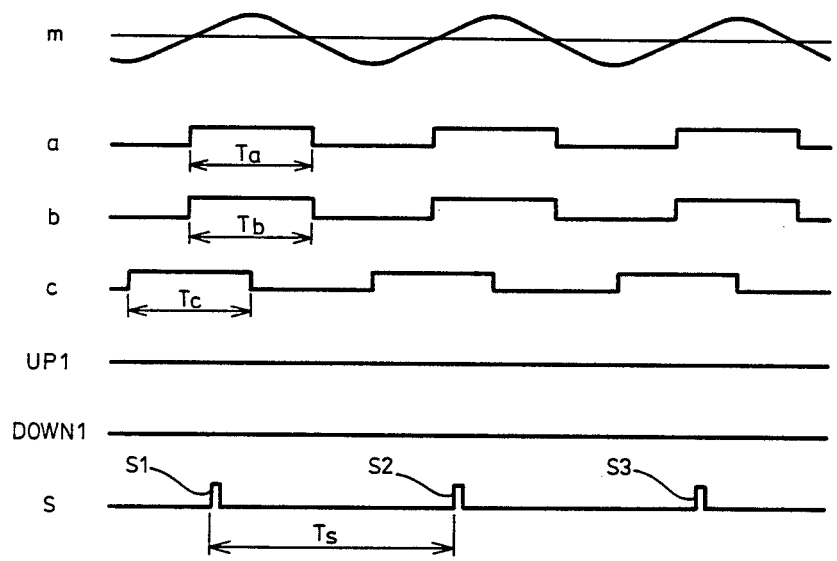
FIG. 5 shows the wave-forms of the main signals generated in the detector of FIG. 3 when the resolver provided therein is at rest.
Figure 6:
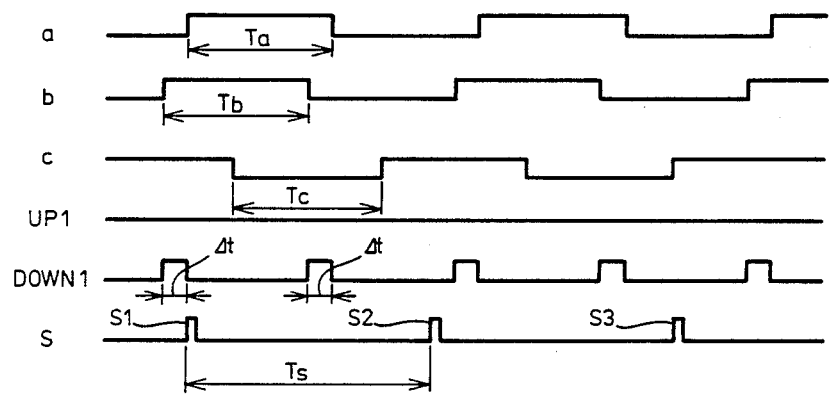
FIG. 6 shows the wave-forms similar to those of FIG. 5, but illustrates the case in which the resolver is rotating counterclockwise at a constant rotational speed.
Figure 7:
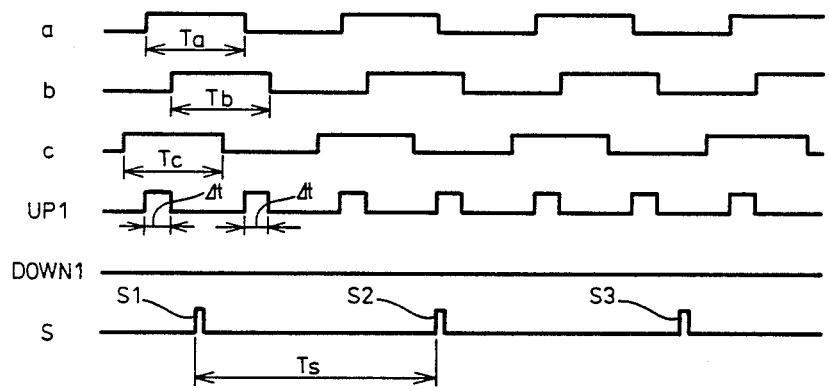
FIG. 7 is a view similar to that of FIG. 6, but shows the case in which the resolver is rotating clockwise at a constant rotational speed.

Referring now to FIGS. 5 to 7 of the drawings, the operation of the embodiment of FIG. 3 is described in more detail.

FIG. 5 shows the wave-forms of the signals developed in the device of FIG. 3 in the case where the rotor 20a of the resolver 20 thereof is at rest. Thus, the modulated signal m outputted from the filter circuit 22 has the same frequency of 5 kHz as the reference signal r and is in phase therewith. Hence, the output signal a of the phase modulation circuit 32 has the half-period Ta equal to the half-period Tr of the reference signal r, i.e., 100 microseconds, and in phase therewith. The phase follower signal b is in phase with the signal a and the half-period Tb thereof is equal to that of the signal a, i.e., 100 microseconds. Thus, neither signals UP 1 nor DOWN 1 is generated, and, as the signal N is identical with the signal CL 3 and the signal P is held at the 0 level, the content of the follower counter 46 increases in pace with that of the reference counter 12. The content of the position counter 38 remains at the same value for neither signal UP 1 or DOWN 1 is supplied thereto. Thus, the value read out by the computer 40 from the counter 38 responsive to the sampling signals s1 through s3 supplied at the sampling period Ts remains the same as it should be.

FIG. 6 represents the wave-forms of the signals generated in the device of FIG. 3 when the rotor 20a of the resolver 20 is rotating anti-clockwise at a constant speed. Thus, the half-period Ta of the output signal a of the phase modulation circuit 32 is increased by, for example, 2 microseconds with respect to the half-period that Tr of the reference signal r, and becomes equal to 102 microseconds. The half-period Tb of the follower signal b is equal to the half-period Ta of the signal a, i.e., 102 microseconds as described below, and the phase thereof leads that of the signal a by a time length Δt which is equal to the difference Tr−Ta of the half-periods Tr and Ta of the reference signal r and the modulated signal a, i.e., 2 microseconds. Thus, the signal DOWN 1 is generated at each end of the half-periods Ta of the signal a, for a duration Δt which is equal to 2 microseconds.

As the second gate circuit 44 suppresses the passage of the clock pulses CL 3 during the time interval Δt during which the signal DOWN 1 is supplied thereto, the content of the follower counter 46 is retained at a constant value during the same period. After the signal DOWN 1 returns to the logical 0 level, the counter 46 resumes the counting of the clock pulses CL 3 supplied thereto in the form of the output N from the second gate circuit 44. Thus, the half-period Tb of the follower signal b is lengthened by 2 microseconds with respect to the reference half-period Tr of the signal r, and thus is rendered equal to that Ta of the signal a, i.e., 102 microseconds. Thus, the phase difference $\Delta t$ between the signals a and b remains 2 microseconds, with the phase of the signal b leading that of the signal a.

The angle by which the rotor 20a of the resolver 20 rotates during each half-period Ta of the signal a is proportional to the difference Tr—Ta between the signals r and a. More specifically, it is equal to the product $\omega(Tr-Ta)=\omega\Delta t$ of the angular frequency $\omega$ of the reference signal r and the difference Tr—Ta between the half-periods Tr and Ta of the signals r and a, which is equal to the phase difference $\Delta t$ between the signals a and b. Thus, the rotor 20a of the resolver 20 is rotating in the case at the rate of 360°×5000 Hz×2 microseconds, which is equal to 3.6°, during the half-period Ta of the signal a.

Because the duration of each pulse of the signal DOWN 1 is equal to 2 microseconds and the pulse rate of the clock signal CL 3 is equal to 5 MHz, the content of the position counter 38 is decreased by 10 every time the signal DOWN 1 is supplied thereto. Thus, the content of the counter 38 is negative and the absolute value thereof increases by a numerical value corresponding to angle of rotation of the rotor 20a of the resolver 20 during the half-periods Ta of the signal a.

The counter's contents corresponds to the overall anti-clockwise angle by which the rotor 20a of the resolver 20 rotates from the beginning of counting by the position counter 38 up to the present. More specifically, the angle rotated by the rotor 20a from the beginning of the counting up to the present is equal to the product of the angular frequency of the reference signal r, the period or spacing of the pulses of the clock signal CL 3, i.e. 0.2 microseconds, and the numerical value stored in the counter 38 which is an accumulation or summation of the number of pulses of the clock signal CL 3 during the time interval when the signal DOWN 1 is supplied thereto.

The numerical values read out from the counter 38 by the computer 40 in response to sampling signals s1 through s3 thus correspond and represent the position of the rotor 20a of the resolver 20 at the instants of the sampling signals s1 through s3, or the angles of rotation thereof, from the beginning of the counting up to the instants of the occurrence of the sampling signals s1 through s3. Thus, the computer 40 can calculate the overall angle rotated by the rotor 20a of the resolver 20 from the time at which the rotor 20a started to rotate to the instant at which the sampling signal s is generated, from the numerical values read out from the position counter 38.

FIG. 7 shows the wave-forms of the signals generated in the device of FIG. 3 in the case where the rotor 20a of the resolver 20 is rotating clockwise at a constant speed. Thus, the half-period Ta of the output a of the phase modulation circuit 32 is shortened by, for example, 2 microseconds with respect to the half-period Tr of the reference signal r.

The half-period Ta is, therefore, to be rendered equal to 98 microseconds. The half-period Tb of the follower signal b is shortened by the same amount of 2 microseconds, but in this case the phase thereof lags behond that of the signal a.

Thus, the signal UP 1 is generated instead of the signal DOWN 1.

The counting of the follower counter 46 proceeds twice as fast as usual during the time interval in which the signal UP 1 is generated because for clock pulses Cl 2 are supplied to the counter 46 in the form of the output signal P from the first gate 42, in addition to the clock pulses CL 3 in the form of th3e output signal N from the second gate 44. This makes the half-period of the follower signal b shorter by 2 microseconds, and the phase difference $\Delta t$ between the signals a and b is kept at the same value of 2 microseconds. Otherwise, the operation in this case is similar to that in the case of constant anti-clockwise rotation of the rotor 20a of the resolver 20 as described above.

Thus, the angle by which the rotor 20a of the resolver 20 rotates during each half-period Ta of the signal a is proportional to the difference Tr—Ta between the half-periods Tr and Ta of the signals r and a.

The fact that the difference Tr—Ta is negative in this case represents the clockwise direction of the rotation of the rotor 20a of the resolver 20. More specifically, it is equal to the product $\omega(Tr-Ta)=\omega\Delta t$ of the angular frequency $\omega$ of the reference signal r and the difference Tr—Ta between the half-periods Tr and Ta of the signals r and a, which is equal to the phase difference $\Delta t$ between the signals a and b. Thus, the rotor 20a of the resolver 20 is rotating in this case at the rate of 360°×5000 Hz×2 microseconds, which is equal to 3.6°, in the clockwise direction during the half-period Ta of the signal Because the duration of the signal UP 1 is equal to 2 microseconds and the pulse rate of the clock signal CL 3 is equal to 5 MHz, the content of the position counter 38 is increased by 10 every time the signal UP 1 is supplied thereto. Thus, the content of the counter 38 is positive in this case and increases by a numerical value corresponding to the angle of rotation of the rotor 20a of the resolver 20 during the half-periods Ta of the signal a.

Therefore, the counter's contents corresponds to the overall clockwise angle rotated by the rotor 20a of the resolver 20 from the beginning of the counting by the position counter 38 up to the present. More specifically, the angle rotated by the rotor 20a from the beginning up to the present is equal to the product of the angular frequency $\omega$ of the reference signal r, the period or spacing of the pulses of the clock signal CL 3, i.e., 0.2 microseconds, and the numerical value stored in the counter 38 which is an accumulation or summation of the numbers of the pulses of the clock signal CL 3 during the time interval during which the signal UP 1 is supplied thereto.

The numerical value read out from the counter 38 by the computer 40 in response to sampling signals s1 through S3 thus corresponds to and represents the position of the rotor 20a of the resolver 20 at the instant of the sampling signals s1 through s3, or the angle of rotation thereof from the beginning of the counting up to the instant of the occurrence of the sampling signals s1 through s3. Thus, the computer 40 can calculate the overall angle rotated by the rotor 20a of the resolver 20 from the time at which the rotor 20a started to rotate to the instant at which the sampling signal s is generated, from the numerical values read out from the position counter 38.

As described above, the phase of the follower signal b generated by the follower counter 46 is the follower circuit 34 is adjusted each time the signals UP 1 or DOWN 1 is generated, i.e., when there exists a phase difference between the signal a of the phase modulation circuit 32 and the follower signal b, by a value corresponding to the phase difference therebetween, and thus the phase follower signal b closely follows that of the signal a of the phase modulation circuit 32. More specifically, the phase difference between the modulated signal a and the follower signal b is kept at a constant value corresponding to the rotational speed of the rotor 20a of the resolver 20 during the time during which the rotor 20a of the resolver 20 is rotating at a constant rotational speed. The phase difference therebetween, however, is quickly reduced to 0 as soon as the rotor 20a of the resolver 20 is stopped.

Further, the maximum and the minimum numbers to which the position counter 38 can count up and down are chosen at large values, e.g., ±10000. Thus, the position counter 38 can follow the rotation of the rotor 20a of the resolver 20 up to 10 rotations thereof. Hence, provided that the rotor 20a of the resolver 20 does not rotate by an angle exceeding 10 rotations during the time interval between the two successive sampling signals s, i.e., the sampling period Ts, the computer 40 can judge the position or the overall rotational angle of the rotor 20a of the resolver 20 from the beginning of the operation up to the present sampling time without error. That is, if the rotor 20a of the resolver 20 is mechanically coupled to an object under measurement, the computer 40 can calculate the position of the object without error and keep track thereof, even when the object is moving at a high speed.

Figure 8:
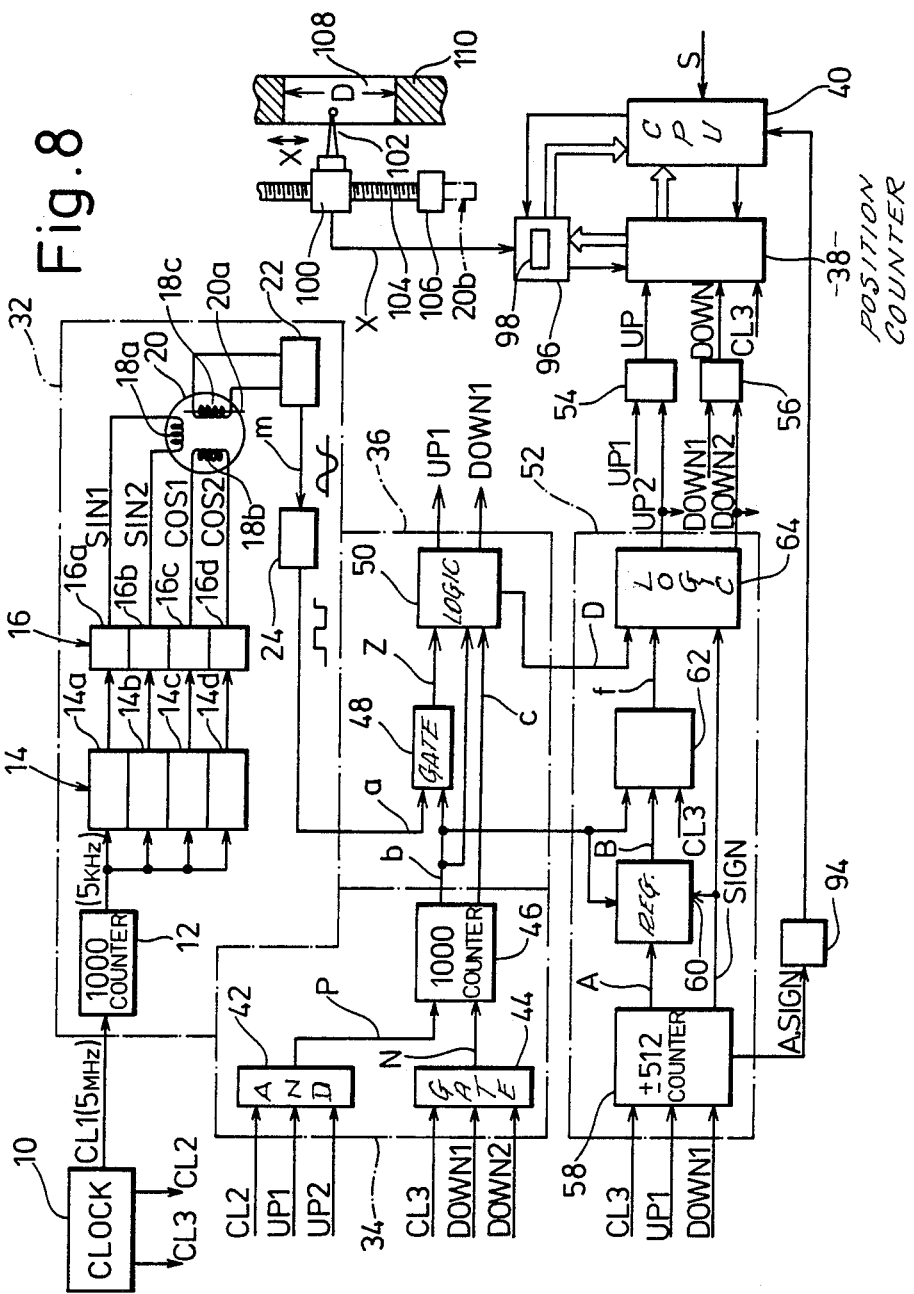
FIG. 8 is a block diagram of another digital position detector of the phase modulation type according to the present invention.

FIG. 8 shows a block diagram of a second embodiment of the present invention which is capable of detecting the position of the object under measurement more precisely at the instant at which a sampling signal is supplied.

The device of FIG. 8 comprises the clock pulse generation circuit 10, the phase modulation circuit 32, the phase follower signal generation circuit 34, the phase difference detection circuit 36, the position counter 38, and the computer 40, which are similar to the corresponding portions of the device of FIG. 3.

In addition the device includes an adjustment circuit 52, which generates signals UP 2 and DOWN 2 corresponding to the rotation speed of the rotor 20a of the resolver 20 in the phase modulation circuit 32.

The adjustment circuit will be described in detail hereinbelow.

The clock pulse generator circuit 10 comprises a clock (not shown) which generates a clock pulse train CLK having a duty factor of 50% at a rate of 10 MHz as shown in FIG. 4. The clock pulse CLK is supplied to a flip-flop (not shown) in the circuit 10, by means of which a clock pulse CL 1 of 5 MHz with a duty factor of 50% is generated. The circuit 10 further comprises inverters and AND gates (not shown) through which the clock pulses CLK and CL 1 are converted into further clock pulse signals CL 2 and CL 3 of the following logical formulas:

$CL2 = CL\ 1 \cdot \overline{CLK}$ $CL3 = \overline{CL\ 2} \cdot \overline{CLK}.$ Clock pulse signals CL 2 and CL 3 are pulse train signals in antiphase having the duty factor 25% and pulse rate or frequency of 5 MHz, as shown in FIG. 4. The pulse signal CL 1 is supplied to the phase modulation circuit 32 while the pulse signals CL 2 and CL 3 are supplied to the phase follower signal generator circuit 34. The clock pulse signal CL 3 is also supplied to the adjustment circuit 52 and the position counter 38.

The phase modulation circuit 32 is essentially the same as the corresponding circuit shown in FIG. 3 which comprises the corresponding elements 12 through 24. Thus, a clock pulse signal CL 1 of 5 MHz with a duty factor of 50% generated in the clock pulse generator 10 is supplied to a modulo 1000 reference counter 12, which divides the frequency of the clock pulse signal supplied thereto by a factor of 1000 to produce a reference signal r of 5 kHz. More specifically the reference signal r corresponds to the content of the counter 12 which counts the clock pulses CL 1 up to 999 and then returns to 0. A decoder circuit 14 comprising the four portions 14a through 14d supplies in sequence a logical output 1 from a portion 14a, 14b, 14c, or 14d to a corresponding portion 16a, 16b, 16c or 16d of the magnetic excitation circuit 16 as the counter 12 takes the value 0 through 249, 250 through 499, 500 through 749, or 750 through 999, respectively.

The excitation circuit 16 energizes the sine and cosine stator windings 18a and 18b of the resolver 18 through the lines SIN 1 and SIN 2 and COS 1 and COS 2, respectively, corresponding to the output of logical 1 from a portion 14a, 14b, 14c, or 14d supplied to a portion 16a, 16b, 16c, or 16d thereof. Thus, a magnetic field rotating in precise synchronization with the content of the counter 12 or the reference signal r is generated by the stator windings 18a and 18b.

The rotor winding 18c is fixedly secured to the rotor of 20a the resolver 20, which is mechanically coupled to the object the position of which is to be measured, e.g., a table of a machine tool mechanically coupled to the resolver through a feed gear system. Thus, the rotor 20a, and therefore the rotor winding 18c is rotated by an angle corresponding to the position of the object to be measured. As a result, a sinusoidally varying voltage is developed in the rotor winding 18c, the phase angle of which corresponds to the rotational angle $\theta$ of the rotor 20a of the resolver 20. This voltage developed across the rotor winding 18c is supplied to the filter 22 and is formed into the phase-modulated electrical signal m having the form of a sine wave with a phase angle corresponding to the rotational angle $\theta$ of the rotor 20a of the resolver 20. Thus, the modulated signal m can be expressed in the form $m = K \sin(\omega t + \theta)$, wherein K is a constant, $\omega$ is the angular velocity of the rotating magnetic field generated by the stator windings 18a and 18b, and $\theta$ is the angle of rotation of the rotor winding 18c with respect to the reference angular position thereof.

The modulated signal m is further supplied to the waveform shaper circuit 24 and is processed into a rectangular wave a which takes the logical value 1 or 0 depending on whether the signal m is positive or otherwise. Thus, the signal a has the same frequency of 5 kHz as the aforementioned reference signal r when the rotor 20a of the resolver 20 is at rest. The frequency of the phase-modulated pulse signal a increases as the rotor 20a of the resolver 20 rotates in the direction opposite to that of the rotation of the magnetic field produced by the stator windings 18a and 18b, and decreases as the rotor 20a rotates in the same direction as the magnetic field produced by the stator windings 18a and 18b which is assumed to be rotating in the anti-clockwise direction. The increase or decrease in the half-period Ta of the signal a corresponds to the increment or decrement in the angle of rotation of the rotor 20a during the same half-period Ta. Thus, the duty factor of the signal a is 50% when the rotor 20a is rotating at a constant speed.

The phase follower signal generation circuit 34 comprises a first and a second gate circuit 42 and 44, and a follower counter 46. The first gate circuit 42 is supplied with the clock signal CL 2 from the clock pulse generation circuit 10, and the signals UP 1 and UP 2 from the phase difference detection circuit 36 and the adjustment circuit 52, respectively, to produce the output signal P which is applied to the follower counter 46. The second gate circuit 44, on the other hand, is supplied with the clock signal CL 3 from the clock pulse generation circuit 10, and the signals DOWN 1 and DOWN 2 from the phase difference detection circuit 36 and the adjustment circuit 52, respectively, to apply the output signal N on the follower counter 46 which generates a phase follower signal b and another signal c in quadrature therewith, as described hereinbelow.

The operation of the first gate 42 is as follows.

The signal UP 1 supplied to the first gate circuit 42 is generated, i.e., takes the logical 1, during the time interval during which the signal a of the phase modulation circuit 32 and the follower signal b are at different logical levels, provided that the phase of the signal a leads that of the signal b. The duration of the signal UP 1 corresponds to the increment in the angle by which the rotor 20a of the resolver 20 rotated during the preceding half-period Ta of the modulated signal a. More precisely, the signal UP 1 is generated when the difference Tr−Ta between the half-periods of the reference and the modulated signal r and a increases, and the duration thereof corresponds to the increment Δt in this difference Tr−Ta during the present half-period Ta of the signal a with respect to the immediately preceding half-period Ta thereof. In other words, it corresponds to the acceleration of the rotor 20a of the resolver 20 during the half-period Ta of the signal a.

The signal UP 2 is generated only when the rotor 20a of the resolver 20 is rotating in the clockwise direction, and consists of the pulses selected from the clock pulses CL 2 or CL 3 at a rate corresponding to the rotational speed of the rotor 20a of the resolver 20 during the immediately preceding half-period Ta of the modulated signal a. More precisely, the signal UP 2 consists of substantially equally spaced pulses selected from the clock pulses CL 2 or CL 3, the number thereof generated during a half-period Tb of the signal b being substantially equal to the number of the clock pulses CL 2 or CL3 that are generated during the time interval which is equal to the difference Tr−Ta between the half-periods Tr and Ta of the signals r and a with respect to the immediately preceding half-period Ta of the signal a. In other words, the number of pulses in the signal UP 2 generated during a half-period Tb of the follower signal b corresponds to the angle by which the rotor 20a of the resolver 20 rotated during the half-period Ta of the signal a immediately preceding the present half-period Tb of the signal b. The generation mechanism of the signals UP 1 and UP 2 will be described in detail hereinbelow.

The first gate circuit 42 effects the following logical operation on the signals CL 2, UP 1, and UP 2 to generate the output signal P:

$$P = \overline{(UP\ 1 + UP\ 2)} \cdot CL2$$

Thus, the signal P is identical with the clock pulse signal CL 2 during the time interval during which the signal UP 1 is generated. Otherwise, it is identical with the signal UP 2.

The operation of the second gate 44 is as follows.

The signal DOWN 1 is generated during the time interval during which the signals a and b take different logical values, provided that the phase of the signal a of the phase modulation ciruit 32 lags behind that of the follower signal b, i.e., provided the rotor 20a of the resolver 20 is accelerating in the anti-clockwise direction of rotation. Thus, the duration of the signal DOWN 1 corresponds to the decrease in the difference Tr−Ta which is proportional to the rotational angle of the rotor 20a of the resolver 20 during the half-period Ta. Hence, the duration of the signal DOWN 1 corresponds to the deceleration of the rotor 20a of the resolver 20 with respect to the clockwise direction of rotation thereof during the half-period Ta of the signal a.

The signal DOWN 2 is similar to the signal UP 2, but is generated only when the rotor 20a of the resolver 20 is rotating in the clockwise direction, i.e., the half-period Ta of the signal a is greater than the half-period Tr of the reference signal r. The signal DOWN 2 consists of the pulses selected from the clock pulses CL 3, at a rate corresponding to the difference Tr−Ta between the half-periods Tr and Ta of the reference and the modulated signal r and a. More precisely, the signal DOWN 2 consists of the substantially equally spaced pulses selected from the clock signal CL 3, the number thereof generated during a half-period Tb of the signal b being equal to the number of the clock pulses CL 3 generated during a time interval which is equal to the difference Tr−Ta of the half-period Tr of the reference signal r and the half-period Ta of the signal a which immediately precedes the present half-period. Thus, the pulse rate of the signal DOWN 2 corresponds to the rotational speed of the rotor 20a of the resolver 20 during the immediately preceding half-period Ta of the signal a. The formation mechanism of the signals DOWN 1 and DOWN 2 will be described in detail hereinbelow.

The second gate circuit 44 effects the following logical operation on the signals CL3, DOWN 1, and DOWN 2 to output the signal N:

$$N = \overline{(DOWN\ 1 + DOWN\ 2)} \cdot CL\ 3$$

Thus, the output N is identical with the clock signal CL 3 when neither the signal DOWN 1 nor DOWN 2 is generated. During the time interval during which the signal DOWN 1 is generated, the gate 44 suppresses the passage of the clock signal CL 3 and the signal N is retained at the logical 0. When the signal DOWN 2 is applied to the gate 44, which consists of the pulses selected from the clock pulses CL 3 at a rate corresponding to the clockwise rotational speed of the rotor 20a of the resolver 20, the gate 44 suppresses the passage of those pulses of the clock signal CL 3 which coincide with the pulses contained in the signal DOWN 2.

The follower counter 46 consists of a modulo 1000 counter which counts the number of pulses contained in the signals P and N supplied thereto from the first and the second gate circuit 42 and 44. The counter 46 counts the number of pulses contained in the signals P and N up to 999 and then returns to 0 to resume the counting anew. When none of the signals UP 1, UP 2, DOWN 1, and DOWN 2 are generated, the counting speed of the counter 46 is the same as that of the reference counter 12, for clock pulses CL 3 are supplied thereto in the form of the signal N. When the signal UP 1 or UP 2 is generated, however, the increase of the content of the counter 46 becomes faster by an amount corresponding to the number of pulses contained in the signal P. On the other hand, when the signal DOWN 1 or DOWN 2 is generated, the counting speed of the follower counter 46 is reduced by a value corresponding to the number of pulses of the clock signal CL 3 which are suppressed by the second gate circuit 44 and thus are removed from the signal N.

The follwer counter 46 generates the follower signal b corresponding to the content thereof, and another signal c in quadrature therewith. More specifically, the signal b takes the logical 1 during the time when the content of the counter 46 is from 0 to 499, and is kept at logical 0 during the time when the content of the counter 46 is from 500 to 999. Thus, when no signal UP 1, UP 2, DOWN 1 or DOWN 2 is generated, the half-period Tb of the signal b is equal to the half-period Tr of the reference signal r. The existence of the signals UP 1, UP 2, DOWN 1 and DOWN 2 shortens or lengthens it. The signal c is in quadrature with the signal b, the phase thereof leading that of the signal b by 90°.

The phase difference detector circuit 36 is similar to the corresponding circuit 36 of the device of FIG. 3. Thus, the phase difference detector circuit 36 comprises exclusive OR element 48 and a logical circuit 50. The exclusive OR element 48 is supplied with the signals a and b from the phase modulation circuit 32 and the follower counter 46 of the phase follower signal generation circuit 34, respectively, and effects the exclusive OR operation thereon to produce the output signal Z given by the following equation:

$$Z = a \oplus b$$

Thus, the signal Z takes the logical value 1 during the time interval during which the values of the signals a and b are different from each other, and otherwise remains at the logical level 0.

The logical circuit 50 receives the signals b, c, and Z, determings whether the signal a leads the signal b in the phases thereof or not, and generates the output signal UP 1 which is identical with the signal Z when the phase of the signal a leads that of the signal b. When the phase of the signal a lags behind that of the signal b, on the other hand, the circuit 50 generates the output signal DOWN 1 which is equal to the signal Z. These output signals of the circuit 50 can be expressed in the logical equations as follows:

$$UP\ 1 = Z(\bar{b}c + b\bar{c})$$

$$DOWN\ 1 = Z(\overline{bc} + bc)$$

The right hand sides of these equations can directly be expressed by the signals a, b, and c as follows:

$$UP\ 1 = a\bar{b}c + \bar{a}b\bar{c}$$

$$DOWN\ 1 = \bar{a}bc + a\bar{b}\bar{c}$$

Thus, it would be easy for those skilled in the art to design other logical circuits which effect the same function as that of the phase detector circuit 36 on the basis of the above expressions of the output signals UP 1 and DOWN 1 thereof. Further, the circuit 50 generates a signal D which takes the same logical value as the signal Z. The signal D is supplied to the adjustment circuit 52.

The adjustment circuit 52 which generates the signals UP 2 and DOWN 2 comprises a rotational speed counter 58, an absolute value register 60 connected to the output of the counter 58, a pulse generation circuit 62 connected to the output of the register 60, and a direction judgment circuit 64 connected to the output of the pulse generation circuit 62 and the SIGN output of the speed counter 58.

The counter 58, which is supplied with the signal CL 3 from the clock pulse generation circuit 10, and the signals UP 1 and DOWN 1 from the phase difference detection circuit 36, comprises a reversible counter having a counting range of from −511 to +511. Thus, the counter 58 counts the number of pulses contained in the clock signal CL 3 as a positive or negative value during the time interval during which the signal UP 1 or DOWN 1 is applied thereon, respectively. Namely, the content of the counter 58 increases during the time interval during which the signal UP 1 is applied thereon, by counting the number of pulses contained in the clock pulse signal CL 3 as a positive number during the same period. When, the other hand, the signal DOWN 1 is applied thereon, the content of the counter 59 decreases by a number which is equal to the number of pulses of the clock signal CL 3 generated during the same period.

As the duration of the signals UP 1 and DOWN 1 is equal to the increment or decrement in the difference Tr−Ta between the half-periods Tr and Ta of the signals r and a, the content of the counter 58 corresponds to this difference Tr−Ta. More specifically, the number stored in the counter is equal to the number of pulses of the clock signal CL 3 generated during the time interval equal to the difference Tr−Ta between the half-periods Tr and Ta of the signals r and a.

On the other hand, the angle by which the rotor 20a of the resolver 20 rotates during a half-period Ta of the signal a is equal to the product $\omega(Tr-Ta)$ of the angular frequency $\omega$ of the reference signal r and the difference Tr−Ta between the half-periods Tr and Ta of the signals r and a. Tus, the rotational speed of the rotor 20a of the resolver 20 is proportional to (Tr−Ta)/Ta. Because the variation of the half-period Ta of the signal a is small compared with the length thereof, and the half-period Ta of the signal a remains substantially equal to the half-period Tr of the reference signal r, the content of the counter 58, which is proportional to the difference Tr−Ta between the half-periods Tr and Ta of the signals r and a, corresponds to the rotational speed V of the rotor 20a of the resolver 20.

Figure 9:
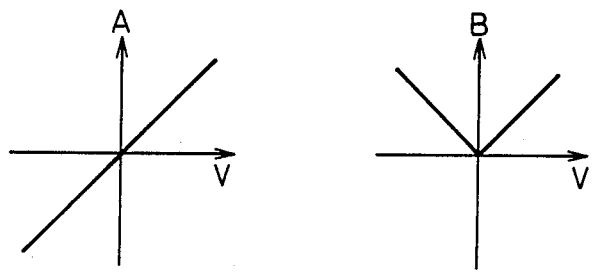
FIG. 9 shows the curves representing the relationships between the rotational speed of the resolver and the values taken by certain signals generated in the adjustment circuit in the detector of FIG. 8.

The speed counter 58 outputs a signal A corresponding to the content thereof. As described above, the signal A is proportional to the rotational speed V as shown in FIG. 9. Another signal SIGN corresponding to the sign of the content of the counter 58 is also generated by the counter 58, which represents the rotational direction of the rotor 20a of the resolver 20, the clockwise and the anti-clockwise direction thereof corresponding to the positive and negative sign thereof, respectively. Thus this signal SIGN takes the logical value 1 when the content of the counter 58 is positive, and the logical value 0 when it is negative.

The absolute value register 60 takes and registers the absolute value of the signal A supplied from the counter 58. The content of the register 60 is updated in response to the rising and falling edge of the follower signal b. Thus, the content of the register 60 corresponds to the absolute value of the difference Tr−Ta between the half-period Tr of the reference signal r and the immediately preceding half-period Ta of the modulated rectangular signal a. In other words, the content of the register 60 corresponds to the absolute value of the rotational speed V of the rotor 20a of the resolver 20 during the preceding half-period Ta of the signal a.

The counter 60 outputs a signal B which corresponds to the content thereof. Thus, the signal B corresponds to the absolute value of the rotational speed V of the rotor 20a of the resolver 20, as shown in FIG. 9. More specifically, the signal B consists of the binary bits B1, B2, −, B9 which represent the number stored therein in the binary notation. Thus, when the number stored in the register 60 is 0, then the signal B consists of nine bits of 0's: B=000000000. When the content of the counter 58 is 1, 2, 3, 4, −, then the signal B takes the value 000000001, 000000010, 000000011, 000000101, etc. In short, the signal B is represented by the bit signals B1 through B9 in the binary notation:

$$B = B9B8 - B1,$$

B1 and B9 being the least and the most significant bits thereof, respectively.

Figure 10:
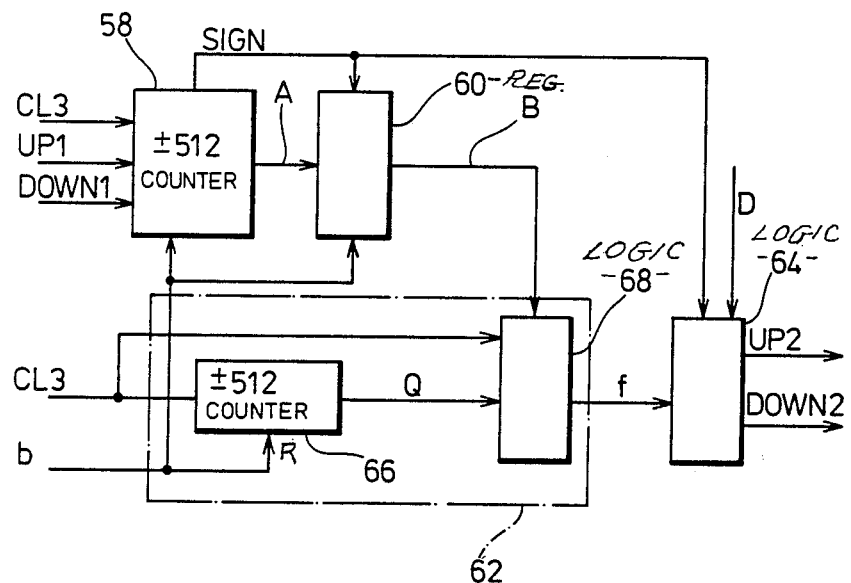
FIG. 10 is a detailed block diagram of the adjustment circuit of the detector of FIG. 8.

The pulse generator circuit 62 is supplied with the signal B from the register 60, the clock signal CL 3 from the clock pulse generator circuit 10, and the follower signal b from the follower signal generation circuit 34. As shown in FIG. 10 of the drawings which shows the adjustment circuit 52 in detail, the circuit 62 comprises a modulo 512 binary counter 66 and a logical circuit 68. The counter 66 counts the number of the clock pulses CL 3 applied thereon up to 511, the content thereof being reset by either the rising or the falling edge of the follower signal b supplied thereto. The counter 66 generates a signal Q corresponding to the content thereof. The logical circuit 68 is supplied with the signal B representing the absolute value stored in the register 60, and, on the basis of the value of the signal Q supplied thereto from the counter 66, selects from the clock pulses CL 3 a set of equally spaced pulses f, the number thereof generated during the counter period Tq of the counter 66 being substantially equal to the absolute value represented by the signal B. That is, the signal f comprises pulses of a frequency B/Tq.

Theoretically, it is desired that the pulse generation circuit 62 generates equally spaced B pulses during the present half-period Tb of the follower signal b, the symbol B herein representing the number which is designated by the signal B, as used also hereinafter. That is, it is theoretically desirable that the frequency of the signal f is equal to B/Tb, because B corresponds to the length of the difference Tr−Ta between the half-period Tr of the reference signal r and the half-period Ta of the signal a which immediately precedes the present half-period Tb of the follower signal b. The variation, however, of the half-period Tb of the signal b is small compared with the absolute value thereof, and thus the half-period Tb is substantially equal to the half-period Tr of the reference signal r which is equal to 100 microseconds. Thus, the above described theoretically desirable frequency B/Tb of the signal f is practically equal to B/Tr. Further, the counter frequency Tq of the counter 66, i.e., the length of time in which the content of the counter 66 increases from 0 to 511 and returns to 0 again, is equal to 0.2 microseconds×512, which is substantially equal to the half-period Tr, i.e., 100 microseconds, of the reference signal r. Thus, the theoretical frequency B/Tb of the signal f is practically equal to the frequency B/Tq, which is the frequency of the signal f generated by the pulse generation circuit 62 of the present embodiment.

Now, the description of the pulse generation circuit 62 of FIG. 10 is continued. The counter 66, after being reset to 0 by a rising or falling edge of the signal b at the beginning of the present half-period Tb thereof, begins to count the number of the clock pulses CL 3 supplied thereto, and generates the signal Q corresponding to the content thereof. More specifically, the output signal Q of the counter 66 consists of the nine bits Q1, Q2, Q3, −, Q9, which together represents the number Q stored therein in binary notion, Q1 and Q9 being the least and the most significant bits thereof, respectively. Thus, when the content of the counter 66 is zero, the output $Q = Q9Q8 - Q1$ is equal to 000000000, the bits Q1 through Q9 being all equal to 0. When the content of the counter 66 is equal to 511, the signal $Q = Q9Q8 - Q1$ consists of nine bits of 1's, i.e., 111111111.

The logical circuit 68 comprises a number of AND gates and effects, for example, the following logical operation on the clock pulse signal CL 3 and the above described bits Q1 through Q9 of the signal Q to form the signals G1 through G9:

$G1 = CL3 \; \overline{Q1} \, \overline{Q2} \, \overline{Q3} \, \overline{Q4} \, \overline{Q5} \, \overline{Q6} \, \overline{Q7} \, \overline{Q8} \, Q9$ $G2 = CL3 \; \overline{Q1} \, \overline{Q2} \, \overline{Q3} \, \overline{Q4} \, \overline{Q5} \, \overline{Q6} \, \overline{Q7} \, Q8$ $G3 = CL3 \; \overline{Q1} \, \overline{Q2} \, \overline{Q3} \, \overline{Q4} \, \overline{Q5} \, \overline{Q6} \, Q7$ $G4 = CL3 \; \overline{Q1} \, \overline{Q2} \, \overline{Q3} \, \overline{Q4} \, \overline{Q5} \, Q6$ $G5 = CL3 \; \overline{Q1} \, \overline{Q2} \, \overline{Q3} \, \overline{Q4} \, Q5$ $G6 = CL3 \; \overline{Q1} \, \overline{Q2} \, \overline{Q3} \, Q4$ $G7 = CL3 \; \overline{Q1} \, \overline{Q2} \, Q3$ $G8 = CL3 \; \overline{Q1} \, Q2$ $G9 = CL3 \; Q1$ Thus, these logical signals G1 through G9 consist of a selection of equally spaced pulses from the clock pulses CL 3, and the number of the pulses contained in the signal Gn (n=1, 2, −, 9)1 generated during the counter period Tq of the counter 66 is equal to the (n=1)th power of 2. For example, the signal G1 comprises one pulse only in the counter period Tq, while the signal G9 comprises 256 pulses in the same period.

The logical circuit 62 further effects a logical operation on the signals G1 through G9 and the logical bits B1 through B9 to generate the desired pulse signal f giving by the following equation:

$$f = G1B1 + G2B2 + - + G9B9$$

Thus, the number of the pulses comprised in the signal f in the counter period Tq of the counter 66 is equal to the number represented by the signal B=B9B8 - B1 in binary notation.

The direction determination circuit 64 is supplied with the pulse signal f from the pulse generation circuit 62, and the signal SIGN from the counter 58, which corresponds to the direction of rotation of the rotor 20a of the resolver 20. The circuit 64 generates the output signals UP 2 or DOWN 2 depending on whether the logical value of the signal SIGN is 1 or 0, respectively:

UP 2=f·SIGN

DOWN 2=f·$\overline{\text{SIGN}}$

Thus, the signal UP 2 is generated only when the signal SIGN takes the logical value 1, and then is identical with the pulse signal f. On the other hand, the signal DOWN 2 is generated only when the signal SIGN is at the logical level 0. The direction determination circuit 64 may further be supplies with the signal D from the logical circuit 50 in the phase difference detection circuit 36, which disables the circuit 64 during the time interval during which the signal Z takes the logical values 1, i.e., during the time interval during which signal UP 1 or DOWN 1 is generated, so that the generation of the signal UP 2 or DOWN 2 is prohibited during the same time interval.

Figure 11:
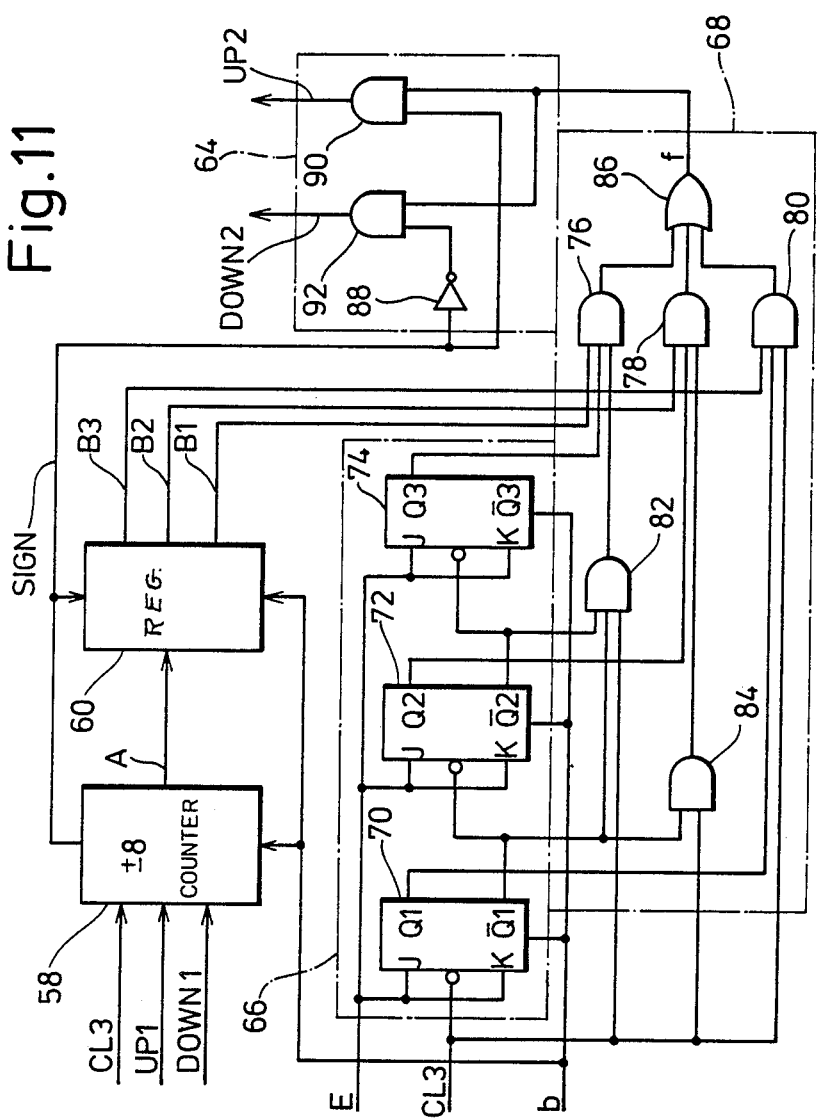
FIG. 11 shows an example of the instrumentation of the adjustment circuit of FIG. 10.

Referring now to FIG. 11 of the drawings, an example of the instrumentation of the pulse generation circuit 62 and the direction determination circuit 64 is described. For the sake of simplicity of description, the figure shows the speed counter 58 as having a counting range of from −7 to +7 instead of −511 to +511. Accordingly, the output B of the register 60 consists of three bits B1, B2, B3 instead of nine, which together represent the number stored therein in the binary notation, i.e., B=B3B2B1. Further, the binary counter 66 is a modulo 8 counter consisting of three flip-flops 70 through 74.

In FIG. 11, the binary counter 66 consists of the first, second, and third JK flip-flops 70, 72 and 74, respectively. The J and K inputs of these flip-flops 70 through 74 are supplied with a positive voltage E. On the other hand, the reset inputs thereof are supplied with the follower signal b which, in this case, is assumed to reset the flip-flops 70 through 74 at both the rising and falling edges thereof. Further, the clock input of the first flip-flop 70 is supplied with the clock signal CL 3, the clock inputs of the second and the third flip-flop 72 and 74 being supplied with the inverse outputs $\overline{Q1}$ and $\overline{Q2}$ of the first and the second flip-flop 70 and 72, respectively.

The output B of the register 60 consists of three logical outputs B1, B2, and B3, the number of which is equal to the number of the flip-flops 70, 72 and 74 constituting the counter 66. The outputs B1, B2 and B3 of the register 60 are coupled to the first, second, and third AND gates 76 through 80, respectively. The inputs of the fourth AND gate 82 is supplied with the clock signal CL 3, the inverse output $\overline{Q1}$ of the first flip-flop 70, and the inverse output $\overline{Q2}$ of the second flip-flop 72. The output of this fourth AND gate 82 and the output Q3 of the third flip-flop 74 are connected to the first AND gate 76, together with the output B1 of the register 60. On the other hand, the fifth AND gate 84 is supplied with the clock signal CL 3 and the inverse output $\overline{Q1}$ of the first flip-flop 70. The output of this fifth AND gate 84 is connected to the second AND gate 78 together with the output Q2 of the second flip-flop 72 and the output B2 of the register 60. The inputs of the third AND gate 80 are supplied with the output Q1 of the first AND gate 70 and the clock signal CL 3, in addition to the signal B3 of the register 60. Further, the inputs of the OR gate 86 are supplied with the outputs of the first, second, and third AND gates 76 through 80, the output of the OR gate 86 constituting the pulse signal f of the pulse generation circuit.

The direction determination circuit 64 of FIG. 11 comprises an inverter 88, and the sixth and seventh AND gates 90 and 92. The inputs of the sixth AND gate 90 are supplied with the output SIGN of the counter 58 and the signal f from the pulse generation circuit 62. On the other hand, the inputs of the seventh AND gate 92 is supplied with the signal f together with the output of the inverter 88, the input of which is coupled to the SIGN output of the counter 58. The outputs of the AND gates 90 and 92 constitute the signals UP 2 and DOWN 2 mentioned hereinabove.

Next, the operation of the circuit of FIG. 11 is described. The flip-flops 70 through 74 constituting the binary counter 66 is reset both by the rising and the falling edges of the follower signal b, the outputs Q1 through Q3 all returning to 0 when it is reset. At the same time, inverse outputs $\overline{Q1}$ through $\overline{Q3}$ thereof are all rendered to 1. As the inputs J and K of the flip-flops 70 through 74 are supplied with the positive voltage E, the flip-flops 70 through 74 change the states thereof at the falling edges of the signal supplied to the clock input thereof.

Figure 12:
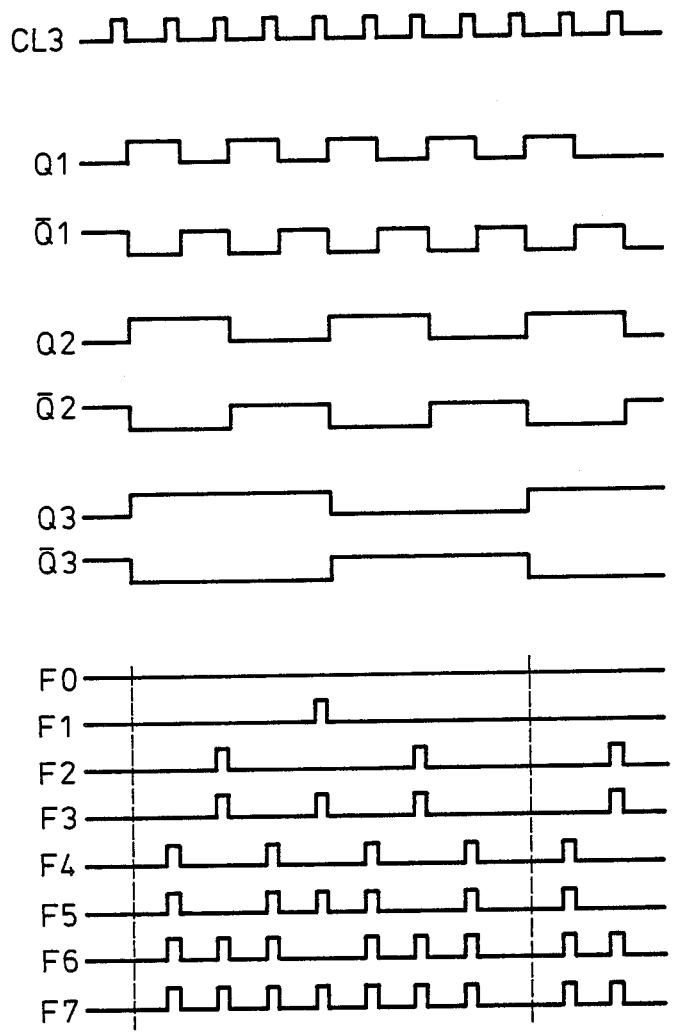
FIG. 12 shows the wave-forms of the main signals generated in the circuit of FIG. 11.

Thus, as shown in FIG. 12, the output Q1 of the first flip-flop 70, which has been reset by an edge of the signal b, rises from 0 to 1 at the first falling edge of the clock pulse signal CL 3 after the reset signal, i.e., the rising or the falling edge of the follower signal b. At the same time the inverse output $\overline{Q1}$ of the first flip-flop 70 falls from 1 to 0. Further, at the time instant at which the next falling edge of the clock pulse signal CL 3 occurs after the passage of the clock pulse period of 0.2 microseconds, the first flip-flop 70 again changes state the output Q1 and the inverse output $\overline{Q1}$ thereof changing from 1 to 0 and 0 to 1, respectively. After this, the first flip-flop 70 changes state at every falling edge of the clock pulse signal CL 3, which occurs at the clock period of the 0.2 microseconds, and repeats the above-described operation thereof. Thus, the outputs Q1 and $\overline{Q1}$ of the first flip-flop 70 are logical signals taking the values 0 and 1 at a period twice as long as that of the clock signal CL 3, i.e., at 0.4 microseconds.

As described above, the J and K inputs of the second flip-flop 72 are supplied with the positive voltage E, the clock input thereof being supplied with the inverse output $\overline{Q1}$ of the first flip-flop 70. Thus, the outputs Q2 and $\overline{Q2}$ of the second flip-flop 72 assume the waveforms as shown in FIG. 12, after they are reset by the reset signal, i.e., the falling or the rising edge of the follower signal b. Namely, the outputs $\overline{Q2}$ and Q2 of the second flop-flop 72 are logical signals taking the values 0 and 1 at a period twice as long as those Q1 and $\overline{Q1}$ of the first flip-flop 70, i.e., at 0.8 microseconds.

Further, the J and K inputs of the third flip-flop 74 are also supplied with the positive voltage E, the clock input thereof being supplied with the inverse output $\overline{Q2}$ of the second flip-flop 72. Thus, it will be easily understood that the outputs Q3 and $\overline{Q3}$ of the third flip-flop 74 are the logical signals taking the values 0 and 1 alternately at a period twice as long as that of the second flip-flop 72, i.e., at 1.6 microseconds.

Next, the operation of the logical circuit 68 of FIG. 11 is described.

The output of the fourth AND gate 82 is equal to the logical product $CL\ 3 \cdot \overline{Q1} \cdot \overline{Q2}$. Thus, the output of the first AND gate 76 is equal to the logical product $$G1 \cdot B1 = CL3 \cdot \overline{Q1} \cdot \overline{Q2} \cdot Q3 \cdot B1.$$

Further, the output of the fifth AND gate 84 is equal to $CL\ 3 \cdot \overline{Q1}$, making the output of the second AND gate 78 equal to $$G2 \cdot B2 = CL3 \cdot \overline{Q1} \cdot Q2 \cdot B2.$$

Furthermore, the output of the third AND gate 80 is equal to $$G3 \cdot B3 = CL3 \cdot Q1 \cdot B3.$$

Thus, the wave-forms F1, F2, and F4 of FIG. 12 are those of the signals G1, G2, and G3, respectively. Hence, using the symbols F1, F2, and F4 instead of G1, G2, and G3, the outputs of the first, second, and third AND gates 76, 78, and 80 can be expressed as follows:

$$G1 \cdot B1 = F1 \cdot B1$$

$$G2 \cdot B2 = F2 \cdot B2$$

$$G3 \cdot B3 \cdot F4 \cdot B3$$

Thus, the output f of the OR gate 86 is given by the following formula:

$$f = F1 \cdot B1 + F2 \cdot B2 + F4 \cdot B3.$$

It will be easily understood that the wave-forms of the signal f corresponding to the values of B=B1 B2 B3 from 0=000 through 7=111 take the forms shown by the wave-forms F0 through F7, respectively.

Next, the operation of the direction judgement circuit 64 of FIG. 11 is described.

When the output SIGN of the counter 58 is at logical 1, the sixth AND gate 90 outputs the signal UP 2 which is identical with the signal f. In this case, the output of the seventh AND gate 92 is retained at logical 0, because a logical 0 is supplied to one of the inputs thereof through the inverter 88 which is supplied with the signal SIGN taking the logical value 1.

On the other hand, when the signal SIGN is at the logical 0 level, the seventh AND gate 92 outputs the signal DOWN 2 which is identical with the signal f of the logical circuit 68, while the output UP 2 of the sixth AND gate 90 is retained at the logical 0 level.

Referring again to FIG. 8 of the drawings, the description of the device shown therein is continued.

The OR gate 54 which is supplied with the signals UP 1 and UP 2 from the phase difference direction circuit 36 and the adjustment circuit 52, respectively, effects the logical addition or the OR operation on these signals to generate the output UP:

$$UP = UP\ 1 + UP\ 2$$

The OR gate 56, on the other hand, is supplied with the signals DOWN 1 and DOWN 2 from the phase difference detection circuit 36 and the adjustment circuit 52, respectively, and also effects the OR operation on these signals to generate the output signal DOWN:

$$DOWN = DOWN\ 1 + DOWN\ 2$$

The position counter 38 comprises a reversible counter having a large counting range of, e.g. from $-10000$ to $+10000$. The counter 38 is supplied with the clock pulses CL 3 in addition to the signals UP and DOWN from the OR gates 54 and 56, and counts the number of pulses of the clock signal CL 3 is a positive value when the signal UP is applied thereon. That is, the content of the reversible counter 38 increases by the number equal to the number of pulses which are generated during the time when the signal UP is at the logical 1 level. On the other hand, when the signal DOWN is applied thereon, the number of pulses contained in the clock pulse signal CL 3 is counted as a negative value, i.e., the content of the counter 38 decreases by the same number.

Thus, the number of those pulses of the clock signal CL 3 that are counted by the counter 38 during each half-period Ta or Tb of the signal a or b corresponds to the difference Tr−Ta between the half-periods Tr and Ta of the signals r and a, which in turn corresponds to the rotational angle of the rotor 20a of the resolver 20 during the same half-period Ta of the signal a. Therefore, the content of the counter 38 corresponds to the rotational angle of the rotor 20a of the resolver 20 from the beginning of the counting up to the present invention. The positive and the negative sign of the content of the counter 38 corresponds the the clockwise and the anticlockwise rotational angle of the rotor 20a of the resolver 20.

The computer 40 responds to the sampling signal s supplied at a sampling period Ts, and reads out the numerical value stored in the position counter 38 at the instant at which the sampling signal s is supplied thereto. The computer 40 can thus calculate, for example, the rotational angle travelled by the rotor 20a of the resolver 20 during the time interval between the two successive sampling signals s, i.e., during each sampling period Ts, or the average rotational speed thereof during the same period. The sampling period Ts can be chosen at any desired value, but is usually fixed at a value substantially longer than that of the half-period Tr of the reference signal r.

Further, a register 94 may be provided which registers the content of the speed counter 58 by means of the signals A and SIGN supplied therefrom. The computer 40 can determine the rotational speed of the rotor 20a of the resolver 20 at an arbitrarily chosen instant by reading the value stored in the register 94. The provision of the register 94 allows the computer 40 to determine the rotational speed of the rotor 20a of the resolver 20 at precisely the instant at which such information is needed, without any involved calculations.

The content of the position contour 38 may further be utilized by a measurement circuit 96 comprising a register 98. A moving element 100 carrying a probe 102 is translated in the X direction through a feeding screw 104 driven by an electric motor 106, the shaft of which is mechanically coupled to the detector shaft 20b of the resolver 20. Thus, the probe 102 carried by the element 100 is driven by the motor 106 through the feeding screw 104 to be translated within the bore 108 of a diameter D formed within the work piece 110 in order to determine the diameter D of the X coordinate of the center of the bore 108. The probe 102 generates a signal X at the instant at which it touches the interior surface of the bore 108 formed in the work piece 110. Utilizing the signal X thus generated by the probe 102 as the read-out command signal, the measurement circuit 96 reads out the content of the counter 38 at the instant at which the signal X is supplied thereto from the probe 102, and registers the value thus read out from the counter 38 in the register 98 thereof.

Thus, the computer 40 can calculate the diameter D or the X coordinate of the center of the bore 108 formed in the work piece 110 by reading out the value stored in the register 98, when such diameter D or the central coordinate X is to be determined. By the way, a measurement unit 96 such as shown in FIG. 8 may also be provided in the device of FIG. 3 and coupled with the counter 38 and the computer 40 thereof.

Figure 13:
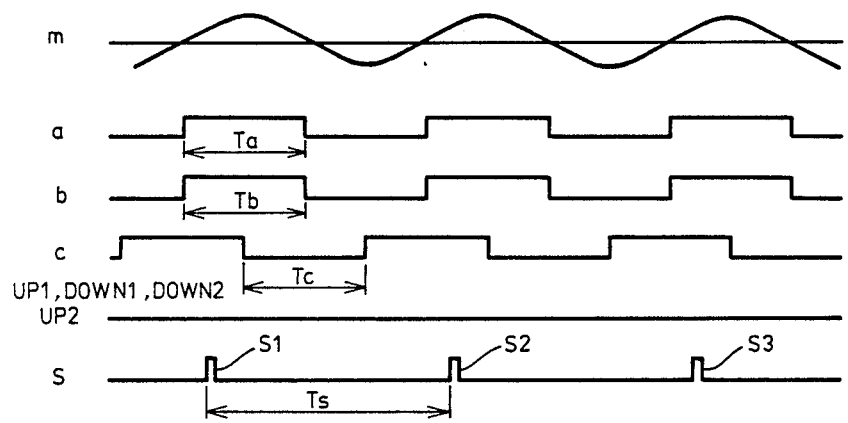
FIG. 13 shows the wave-forms of the main signals generated in the detector of FIG. 8 in the case in which the resolver provided therein is at rest.
Figure 14:
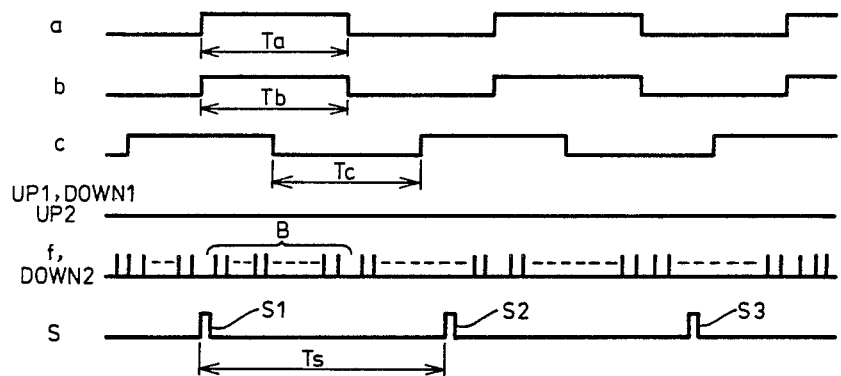
FIG. 14 is a view similar to that of FIG. 13, but shows the case in which the resolver is rotating anti-clockwise at a constant rotational speed.
Figure 15:
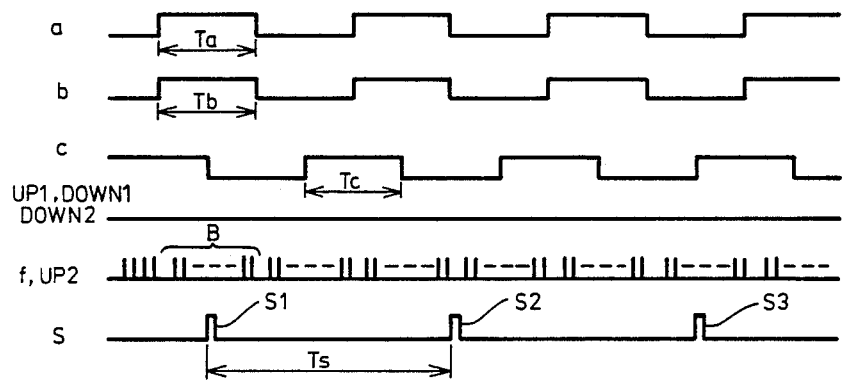
FIG. 15 is also a view similar to that of FIG. 13, but shows the case in which the resolver is rotating clockwise at a constant rotational speed.

Next, referring to FIGS. 13 through 15 of the drawings, the operation of the device of FIG. 8 in the case in which the rotor 20a of the resolver 20 is at rest or is rotating at a constant rotational speed is described.

FIG. 13 shows the wave-forms of the signals in the case in which the rotor 20a of the resolver 20 is at rest. Thus, the modulated sinusoidal signal m generated by the shaper circuit 22 in the phase modulation circuit 32 has a half-period equal to the half-period Tr of the reference signal r, i.e., 100 microseconds. Hence, the half-period Ta of the modulated rectangular pulse signal a outputted from the phase modulation circuit 32 is also equal to the half-period Tr of the reference signal r. The follower signal b is in phase with the signal a, the half-period Tb thereof also being equal to that of the reference signal r. No signal UP 1, UP 2, DOWN 1, or DOWN 2 is generated, and the content of the speed counter 58 stays at the value zero. The content of the counter position 38 stays at a constant value which the counter 38 assumed when the rotor 20a of the resolver 20 was set at rest. Thus, the rotational angle read out by the computer 40 from the counter 38 responsive to the sampling signals s1 through s3 supplied thereto remains at the above mentioned constant value.

FIG. 14 shows the case in which the rotor 20a of the resolver 20 is rotating at a constant speed in the anticlockwise direction. Thus, the half-period Ta of the modulated rectangular signal a becomes longer by an amount corresponding to the rotational speed of the rotor 20a of the resolver 20, for example, by 3 microseconds, so that it becomes equal to 103 microseconds. The content of the speed counter 58 stays at a value corresponding to the rotational speed of the rotor 20a of the resolver 20, i.e., at −15. Thus, the number B the pulses generated in the signal f or DOWN 2 during a half-period Tb of the follower signal B is equal to 15. Thus, the half-period Tb of the signal b is made longer by the corresponding value of 0.2 microseconds×15=3 microseconds to become equal to the half-period Ta of the signal a, i.e., 103 microseconds, because the second gate 44 in the follower circuit 34 prohibits the passage of those pulses of the clock signal CL 3 which coincide with the pulses contained in the signal DOWN 2. Hence, the follower signal b is kept in phase with the signal a, and neither signals UP 1 nor DOWN 1 is generated.

The content of the position counter 38 decreases by 15 during every half-period Ta or Tb of the signal a or b. Thus, the content of the counter 38 corresponds to the overall rotational angle of the rotor 20a of the resolver 20 from the time point at which the counter 38 returned to 0 up to the present time point. Thus, the value of the position counter 38 read out by the computer 40 at each sampling signal s1 through s3 is decreased during every sampling period Ts by a number which is equal to that of the pulses occurring in the signal f or DOWN 2 during the same period.

FIG. 15 shows the case in which the rotor 20a of the resolver 20 is rotating in the clockwise direction at a constant rotational speed. Thus, the half-period Ta of the signal a of the phase modulation circuit 32 is rendered shorter by a value corresponding to the rotational speed of the rotor 20a of the resolver 20, e.g., by 2 microseconds. Thus, the content of the speed counter 58 is kept at +10, and the number B of the pulses generated in the signal f or UP 2 during the half-period Tb of the follower signal b is equal to 10. The half-period Tb of the follower signal b is thus made shorter by 2 microseconds, to become equal to the half-period Ta of the signal a, for the pulses of the signal UP 2 are supplied to the follower counter 46 in the form of the signal P in addition to the clock signal CL 3 in the form of the signal N. Thus, the follower signal b is in phase with the signal a. As in the case of the operation shown in FIG. 14, the content of the speed counter 58 is the accumulation or summation of the values corresponding to the durations of the signals UP 1 or DOWN 1 which have been generated up to the present moment.

The content of the position counter 38 increases as the signal UP 2 is supplied thereto in the form of the signal UP. The increase thereof is equal to the number of the pulses contained in the signal UP 2. Thus, the content of the counter 38 corresponds to the overall rotational angle by which rotor 20a of the resolver 20 has rotated in the clockwise direction from the beginning of the counting up to the present instant. The computer 40 reads out the value stored in the counter 38 responsive to the sampling signals s1 through s3 occurring at the sampling period Ts.

Figure 16:
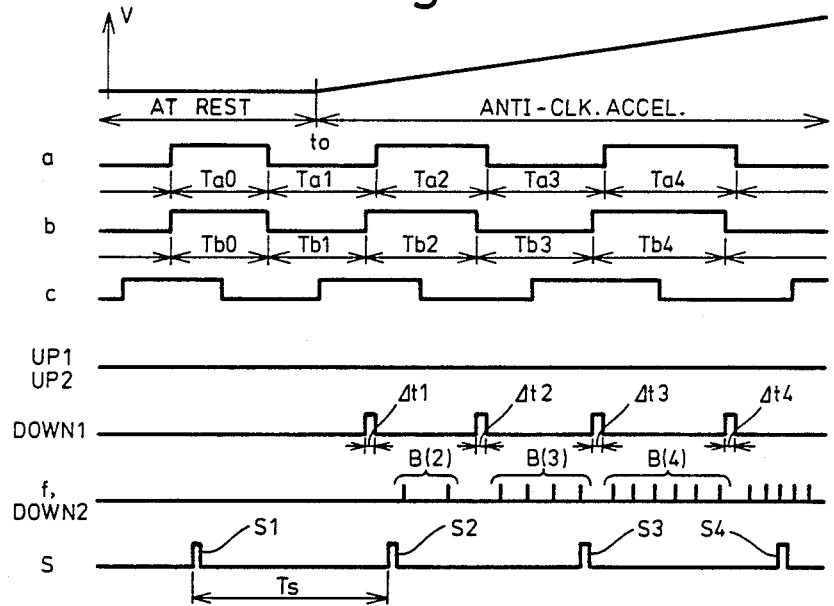
FIG. 16 shows the wave-forms of the main signals generated in the detector of FIG. 8 when the resolver is accelerated in the anti-clockwise direction from the state of rest.

Referring now to FIG. 16 of the drawings, the operation of the device of FIG. 8 in the case in which the rotor 20a of the resolver 20 is accelerated in the anticlockwise direction is described.

As shown by the uppermost curve, the rotor 20a of the resolver 20 is at rest up to the time point t0. At the time point t0, the rotor 20a of the resolver 20 begins to rotate in the counterclockwise direction, the rotational speed V thereof being increased from 0 at a substantially constant rate from the time point t0. That is, the rotor 20a of the resolver 20, which has been at rest, is accelerated in the counter-clockwise direction at a constant rate from the time point t0.

As the rotor 20a of the resolver 20 begins to rotate and the rotational speed V thereof increases, the half-period Ta of the signal a of the phase-modulation circuit 32 is lengthened. The first half-period Ta0 thereof is equal to the half-period Tr of the reference signal r, i.e., 100 microseconds, because the rotational speed V of the rotor 20a is equal to 0 during the same half-period. As the rotor 20a of the resolver 20 begins to rotate, the half-periods Ta1 through Ta4 are lengthened successively by an amount corresponding to the rotational speed V of the rotor 20a. More precisely, the half-periods Ta1 through Ta4 are made longer with respect to the half-period Tr of the reference signal r, by an amount corresponding to the angle by which the rotor 20a of the resolver 20 rotates during the same half-periods Ta1 through Ta4, respectively. Thus, the half-periods Ta of the signal a increases successively, by a constant increment of, for example, 0.4 microseconds, which corresponds to the acceleration of the rotor 20a of the resolver 20 during the same half-period Ta of the signal a, so that the half-period Ta1 comes to be equal to 100.4 microseconds, Ta2 to 100.8 microseconds, Ta3 to 101.2 microseconds, and Ta4 to 101.6 microseconds, etc.

The half-periods Tb of the follower signal b are also successively lengthened following those half-periods Ta of the signal a. The first two half-periods Tb0 and Tb1 are equal to the half-period Tr of the reference signal r, however, for no adjustment signal UP 1, UP 2, DOWN 1, or DOWN 2 is generated during these half-periods. After this, the half-period Tb of the signal b is lengthened successively, so that the half-period Tb2 is equal to 100.8 microseconds, Tb3 to 101.2, and Tb4 to 101.6 microseconds, respectively. The explanation of the mechanism for the lengthening of the half-periods Tb of the follower signal b will follow.

As described above, although the half-period Ta1 of the signal a is lengthened to 100.4 microseconds, the half-period Tb1 of the follower signal b remains 100 microseconds, because none of the signals UP 1, UP 2, DOWN 1, and DOWN 2 are generated during the same half-period Tb1. Thus, the signal DOWN 1 is generated at the end of the half-period Ta1 of the signal a. The duration or the pulse width Δt1 of the signal DOWN 1 is equal to the difference Ta1−Tb1 between the half-periods Ta1 and Tb1 of the signals a and b, i.e., equal to 0.4 microseconds.

Thus, two pulses of the clock signal CL 3 are generated during the time interval Δt1 during which the signal DOWN 1 is generated. Hence, the content of the speed counter 58 decreases from 0 to −2, so that two pulses are generated in the signal f and the signal DOWN 2 during the next half-period Tb2 of the signal b, i.e., the number B(2) of pulses contained in the signal f or DOWN 2 within the half-period Tb2 is equal to 2.

Because of the existence of the signals DOWN 1 and DOWN 2, the former having the duration of 0.4 microseconds and the latter containing two pulses therein, the next half-period Tb2 becomes equal to 100.8 microseconds. That is, each of the signals DOWN 1 and DOWN 2 suppresses two pulses of the clock signal CL 3 at the second gate 44 in the follower signal generation circuit 34, thereby lengthening the half-period Tb2 by 0.8 microseconds. During this half-period Tb2 of the follower signal b, the content of the position counter is decreased by 4 and becomes equal to −4, assuming that the content thereof was 0 at the time point t0. That is, the content of the counter 38 is decreased by 2 during the generation of the signal DOWN 1, and then further by 2 due to the generation of the two pulses in the signal DOWN 2.

Thus, at the end of the half-period Ta2 of the signal a another signal DOWN 1 having duration Δt2 of 0.4 microseconds is generated, which corresponds to the phase difference between the two signals a and b at that time point. Thus, 2 pulses of the clock signal CL 3 are generated during the time interval Δt2 which is equal to 0.4 microseconds.

Thus, the content of the speed counter 58 is further decreased by 2 during the time interval Δt2 to become equal to −4. The signal DOWN 2 generated during the next half-period Tb3 of the signal b, therefore, contains 4 pulses as designated by B(3) in FIG. 16. Thus, the half-period Tb3 is lengthened by 1.2 microseconds with respect to the half-period Tr of the reference signal r, to become equal to 101.2 microseconds, because 2 and 4 pulses of the clock signal CL 3 are suppressed at the second gate 44 due to the signals DOWN 1 and DOWN 2, respectively. The content of the position counter decreases by 6 in the same half-period Tb3 to become equal to −10, which corresponds to the anti-clockwise angle by which the rotor 20a of the resolver 20 has rotated from the time point t0. More specifically, the content of the counter 38 decreases by 2 during the time interval Δt2, and then is further decreased successively as the pulses of the signal DOWN 2 are generated.

Thus, at the end of the half-period Ta3 of the signal a, another signal DOWN 1 having duration Δt3 of 0.4 microseconds is generated, which corresponds to the phase difference between the two signals a and b at that time point. Two pulses of the clock signal CL 3 are generated during the time interval Δt3 which is equal to 0.4 microseconds.

Thus, the content of the speed counter 58 is further decreased by 2 during the time interval Δt3 to become equal to −6. The signal DOWN 2 generated during the next half-period Tb4 of the signal b, therefore, contains 6 pulses as designated by B(4) of FIG. 16. Thus, the half-period Tb4 is lengthened by 1.6 microseconds with respect to the half-period Tr of the reference signal r, to become equal to 101.6 microseconds, because 2 and 6 pulses of the clock signal CL 3 are suppressed at the second gate 44 due to the signals DOWN 1 and DOWN 2, respectively. The content of the position counter 38 decreases by 8 in the same half-period Tb4 to become equal to −18, which corresponds to the anticlockwise angle by which the rotor 20a of the resolver 20 has rotated from the time point t0 by the end of the same half-period Tb4. More specifically, the content of the counter 38 decreases by 2 during the time interval Δt3, and then is further decreased successively as the pulses of the signal DOWN 2 are generated.

At the end of the half-period Ta4 of the signal a, further signal DOWN 2 having a duration Δt4 of 0.4 a microseconds is generated, so that the signal DOWN 2 generated during the next half-period of the signal b will contain 8 pulses. Assuming that the sampling signals s1 through s4 are provided by the rising edges of the corresponding pulses s1 through s4 shown in FIG. 16, the values read out by the computer 40 from the position counter 38 at the sampling signals s1 through s4 will be equal to 0, −2, −10, and −22, respectively.

Further operation of the device of FIG. 8 in the case of constant anti-clockwise acceleration will be easily understood from the description above.

Figure 17:
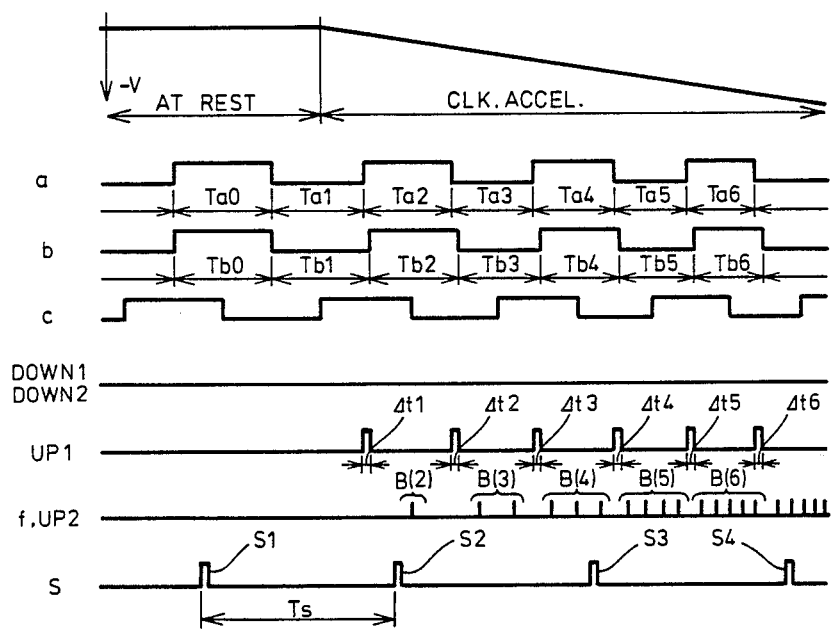
FIG. 17 is a view similar to that of FIG. 16, but shows the case in which the resolver is accelerated in the clockwise direction from the state of rest.

Referring now to FIG. 17 of the drawings, the operation of the device of FIG. 8 in the case in which the rotor 20a of the resolver 20 is accelerated in the clockwise direction is described.

As shown by the uppermost curve, the rotor 20a of the resolver 20 is at rest up to the time point t0. At the time point t0, the rotor 20a of the resolver 20 begins to rotate in the clockwise direction, the rotational speed V thereof being increased from 0 at a substantially constant rate from this time point t0 in the clockwise direction. That is, the rotor 20a of the resolver 20 is accelerated at a constant rate in the clockwise direction from the time point t0.

As the rotor 20a of the resolver 20 begins to rotate and the rotational speed V thereof increases, the half-period Ta of the signal a of the phase-modulation circuit 32 is shortened. The first half-period Ta0 thereof is equal to the half-period Tr of the reference signal r, i.e., 100 microseconds, because the rotational speed V of the rotor 20a is equal to 0 during the same half-period Ta0. As the rotor 20a of the resolver 20 begins to rotate, the half-periods Ta1 through Ta6 are shortened successively by an amount corresponding to the rotational speed V of the rotor 20a. More precisely, the half-periods Ta1 through Ta6 are made shorter by an amount corresponding to the angle by which the rotor 20a of the resolver 20 rotates during the same half-periods Ta1 through Ta6. Thus, the half-period Ta of the signal a decreases successively, by a constant decrement of, for example, 0.2 microseconds, so that the half-period Ta1 becomes equal to 99.8 microseconds, Ta2 to 99.6 microseconds, Ta3 to 99.4 microseconds, Ta4 to 99.2 microseconds, Ta5 to 99.0 microseconds, and Ta6 to 98.8 microseconds.

Thus, at each end of the half-periods Ta1 through Ta6 of the signal a, the signal UP 1 is generated which has the duration $\Delta$ t1 through $\Delta$ t6, respectively, during which one clock pulse each of the clock signals CL 2 and CL 3 are generated. Thus, the content of the speed counter 58 is increased by 1 by each pulse of the signal UP 1, so that it becomes equal to 1, 2, 3, 4, and 5 during the half-periods Tb2 through Tb6 of the signal b, respectively. Hence, the signal UP 2 contains a corresponding number 1, 2, 3, 4, and 5 of pulses in the half-periods Tb2 through Tb6, respectively, which are designated by B(2) through B(6) in FIG. 17. Thus, the half-periods Tb of the follower signal b are shortened correspondingly, because the clock signal CL 2 and the signal UP 2 are supplied to the follower counter 46 in the form of the signal P from the first gate 42 due to the existence of the signals UP 1 and UP 2, in addition to the clock pulses CL 3 in the form of the signal N from the second gate 44.

The content of the position counter 38 increases by 1 at the end of the half-periods Tb1 through Tb6 of the signal b, because the signal UP which is identical with the signal UP 1 is applied thereon during the time intervals $\Delta$ t1 through $\Delta$ t6. The content of the counter 38 is further increased within the half-periods Tb2 through Tb6 by the number B(2) through B(6), respectively, as the pulses generated in the signal UP 2 are supplied to the counter 38 in the form of the signal UP. Thus, assuming that the content of the counter 38 is equal to 0 at the time point t0 and that the rising edges of the pulses s1 through s4 shown in FIG. 17 constitute the sampling pulses s1 through s4, the values read out by the computer 40 from the position counter 38 responsive to the sampling signals s1 through s4 are equal to 0, 1, 8, and 22, respectively.

As described above, the content of the position counter 38 in the case of the device of FIG. 8 closely follows the rotational angle of the rotor 20a of the resolver 20, so that the the values sampled by the computer 40 therefrom responsive to the sampling signals s very closely corresponds to the present position of the rotor 20a of the resolver 20.

Figure 18:
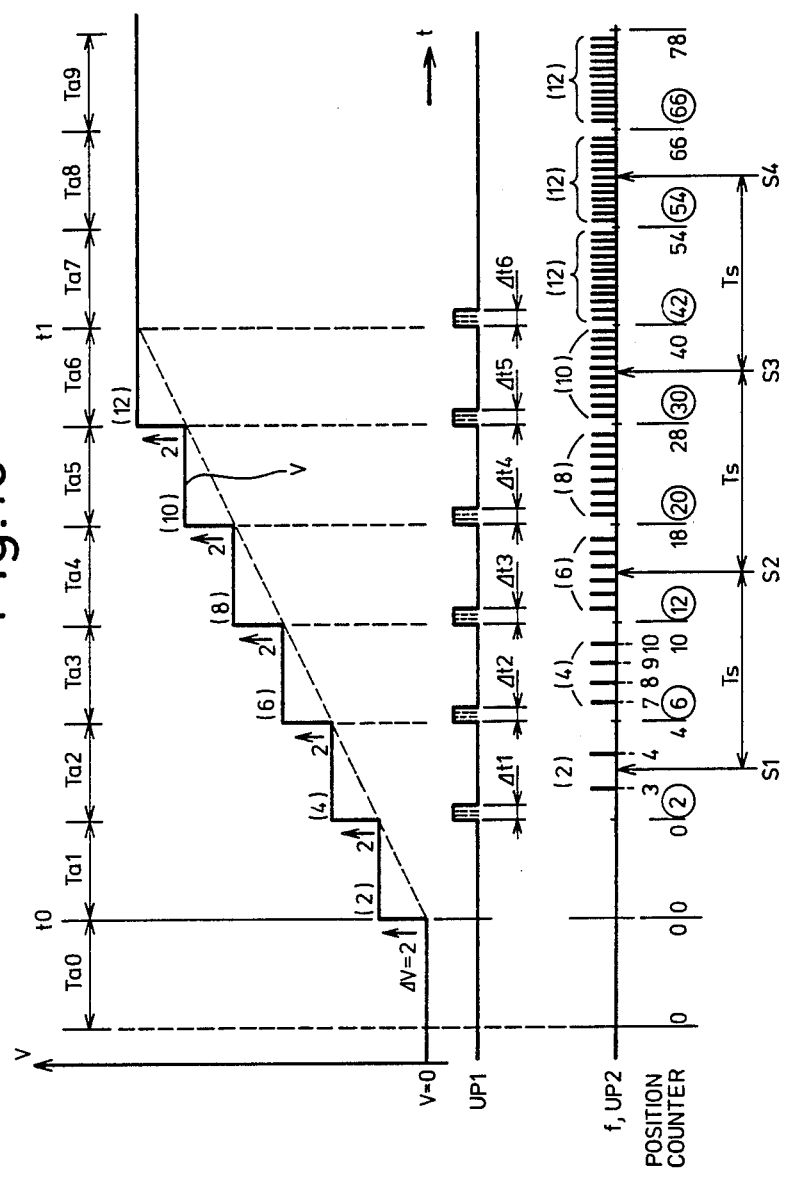
FIG. 18 shows the values of the content of the position counter in connection with the main signals generated in the detector of FIG. 8, in the case in which the resolver is accelerated in the clockwise direction from the state of rest to reach a constant rotational speed after a certain period of acceleration.

Referring now to FIG. 18 of the drawings, a further example of the operation of the device of FIG. 8, in particular, that of the position counter 38, is described in more detail.

FIG. 18 shows the curve of the rotational speed V of the rotor 20a of the resolver 20 of the device of FIG. 8, together with the wave-forms of the signals UP 1, UP 2, and f, and the corresponding contents of the position counter 38, in the case in which the rotor 20a of the resolver 20, previously at rest, is accelerated in the clockwise direction from the time point t0 to the time point t1, at which time the rotor 20a of the resolver 20 attains a constant speed.

The rotational speed V of the rotor 20a of the resolver 20 is equal to 0 before the time point t0, at which time command signal is given, for example, to the motor 106 coupled to the rotor 20a, to increase the rotational speed V thereof by an amount $\Delta$ V=2 in the clockwise direction, i.e. by an amount corresponding to the shortening of the half-period Ta1 by a length corresponding to 2 clock pulses of the clock signal CL 2 or CL 3. At the end of the half-period Ta1 of the signal a, another command signal is supplied to the motor 106 to increase the rotational speed of the rotor 20a of the resolver 20 by the same amount $\Delta$ V=2 so that the speed V thereof is increased to a value V=4 as shown by the bracketed numeral in FIG. 18, corresponding to the shortening of the half-period Ta of the signal a by an amount corresponding to 4 clock pulses. After this, at every end of the half-periods Ta2 through Ta5, a similar command signal to increase the rotational speed V of the rotor 20a of the resolver 20 in the clockwise direction by an increment $\Delta$ V=2 is supplied to the motor 106, so that the rotor 20a of the resolver 20 is accelerated accordingly to reach the rotational speed V=12 in the half-period Ta6 of the signal a. In FIG. 18, by the way, the bracketed numerals at the curve V show the values of V in the corresponding half-periods Ta.

Thus, the half-periods Ta of the signal a are successively shortened. The half-period Ta0 before the time point t0, which is equal to the half-period Tr of the reference signal r, is shortened by a decrement corresponding to 2 clock pulses to the first half-period Ta1 after the time point t0. The following half-periods Ta2 through Ta6 are successively shortened by the same decrement corresponding to the increment $\Delta$ V in the rotational speed of the rotor 20a of the resolver 20. Thus, the half-period Ta6 becomes shorter than the half-period Tr of the reference signal r by an amount corresponding to 12 clock pulses. Thereafter, the half-periods Ta7 through Ta9 remain at a constant length, for the rotational speed V of the rotor 20a of the resolver 20 is kept at the constant value V=12 during the same half-periods.

Thus, adjacent to the ends of the half-periods Ta1 through Ta6, the pulses of the signal UP 1 are generated corresponding to the phase difference between the signals a and b, which have the durations $\Delta$ t1 through $\Delta$ t6, respectively, during each of which 2 clock pulses of the clock signals CL 2 and CL 3 are generated. Hence, the content of the speed counter 58, which was 0 during the half-period Ta1, is increased successively by the pulses $\Delta$ t1 through $\Delta$ t6 of the signal UP 1 by an increment of 2, so that it is equal to 2, 4, 6, 8, 10, and 12 at the beginnings of the corresponding half-periods Tb2 through Tb7 of the signal b, respectively. Thus, the signal f and therefore the signal UP 2 contain 2, 4, 6, 8, 10, and 12 evenly spaced pulses in the half-periods Ta2, Ta3, Ta4, Ta5, Ta6, and Ta7 through Ta9, respectively.

The content of the position counter 38 increases as indicated by the lowermost numerals in FIG. 18. The content of the counter 38 is 0 at the time point t0 and remains to be 0 during the half-period Ta1. During the short time interval during which the pulse $\Delta$ t1 of the signal UP 1 is generated, the content of the counter 38 increases abruptly to 2 as indicated by the circled numeral 2 in FIG. 18. As the pulses of the signal UP 2 are generated, the content of the counter 38 increases correspondingly from 2 to 3 and 3 to 4, and thus becomes equal to 4 at the end of the half-period Ta2.

At the beginning of the half-period Ta3, another pulse Δ t2 of the signal UP 1 is generated, and 2 pulses of the clock signal CL 3 are counted by the counter 38. Thus, during the time interval Δ t2, the content of the counter 38 increases abruptly by 2 to become equal to 6 as indicated by the circled numeral in the lowermost line of FIG. 18. During the half-period Ta3, 4 evenly spaced pulses of the signal UP 2 are generated, so that the content of the counter 38 increases from 6 to 7, 8, 9, and 10, as the pulses of the signal UP 2 are applied thereon in the form of the signal UP. Thus, at the end of the half-period Ta3, the content of the counter 38 equals 10.

Thereafter, the content of the counter 38 is increased by 2 during each one of the pulses Δ t3 through Δ t6 of the signal UP 1 which are generated at the beginning of the half-periods Ta4 through Ta7, respectively. Within the half-periods Ta4 through Ta7, the content of the counter 38 increases by 6, 8, 10, and 12 due to the generation of the corresponding number of pulses of the signal UP 2 as indicated by the bracketed numerals in FIG. 18, which are applied on the counter 38 in the form of the signal UP through the OR gate 54. After the half-period Ta7, no pulses of the signal UP 1 are generated, and there is no increase in the content of the counter 38 that is due to the pulses of the signal UP 1. Thus, the content of the counter 38 increases only by 12 each during the half-periods Ta8 and Ta9 due to the corresponding number of pulses of the signal UP 2 generated during the same half-periods. Hence, the content of the counter 38 at the end of the half-periods Ta4 through Ta9 is equal to the number shown thereat in the lowermost line in FIG. 18. The content of the counter 38 at the beginning of these half-periods Ta4 through Ta9, after the generation of the pulses Δ t3 through Δ t6 of the signal UP 1 in the case of the half-periods Ta4 through Ta7, is equal to the circled numbers shown thereat in the lowermost line in FIG. 18.

Thus, if the sampling signals s1 through s4 as indicated by the arrows s1 through s4 in FIG. 18 are generated at the sampling periods Ts, the values read out by the computer 40 from the counter 38 responsive to these sampling signals s1 through s4 are equal to 3, 15, 35, and 60, as will readily be read out from FIG. 18.

The embodiment shown in FIG. 8 is susceptible of several modifications which may be preferred in certain applications.

According to the first of these, the signal UP 1 and DOWN 1 of the phase difference detection circuit 36 are inputted only to the speed counter 58, the position counter 38 receiving only the signals UP 2 and DOWN 2. In the case of this modification, the content of the counter 38 increases more steadily, for the pulses constituting the signals UP 2 and DOWN 2 are substantially evenly spaced. There exists, however, a certain delay in the detected position of the rotor 20a of the resolver 20 corresponding to the half-period of the resolver 20 when the rotor 20a is rotating. No time delay is observed, however, if the rotor 20a of the resolver 20 is at rest.

According to the second of these modifications, the logical circuit 50 in the phase difference detection circuit 36 is modified in such a way that only the phase differences between the signals a and b at the rising edges thereof are outputted therefrom as the signals UP 1 and DOWN 1. Generally speaking, the duty factor of the signal a of the phase modulation circuit 32 does not equal 50%, so that the signals UP 1 and DOWN 1 are outputted alternately even when the rotor 20a of the resolver 20 is at rest. Thus, the content of the counter 38 fluctuates, i.e., is subject to alternate increases and decreases. According to this modification, however, signals UP 1 and DOWN 1 are not generated when the rotor 20a is at rest, irrespective of the duty factor of the signal a. Thus, no fluctuation of the content of the counter 38 occurs when the rotor 20a of the resolver 20 is at rest.

According to the third modification, the first and the second modification as described above are combined, so that only the signals UP 2 and DOWN 2 are supplied to the position counter 38, and the signals UP 1 and DOWN 1 which are generated only at the rising edges of the signals a and b are not supplied thereto. In the case of this modification, the rotational position of the rotor 20a of the resolver 20 which comprises a time delay corresponding to the period of the resolver 20 is detected. There is no time delay, however, when the rotor 20a of the resolver 20 is at rest.

As described above, according to the present invention, the phase of the signal which is modulated in accordance with the rotational position of the detector shaft is not compared directly with that of the reference signal, but with the follower signal, the half-periods or the periods of which are adjusted to those of the modulated signal, i.e., are lengthened or shortened corresponding to the lengthening or shortening of the half-periods or periods of the modulated signal. Thus, the present invention removes the limitation of this type of device as to the speed of the object under position measurement, which was inherent in the position detectors utilizing the phase modulation method such as resolvers.

Further, the generation and the counting of the substantially equally spaced pulses which are generated during the present period or half-period of the modulated signal at a rate corresponding to the speed of the detector shaft during the immediately preceding period or half-period thereof allow the precise determination of the position of the object under measurement, which is comparable in precision to that by, for example, pulse encoders. Thus, the device according to the present invention is applicable to those areas to which the phase modulating type position detectors have hitherto been inapplicable. For example, the present invention allows the resolvers to be used as position detectors in the fast moving automatically controlled machines such as industrial robots. The advantages resulting from the fact that resolvers can be used as position detectors instead of pulse encoders in such areas are not small, for the provision of pulse encoders entails high cost and involved circuits associated therewith.

Although the present invention has been described in connection with certain embodiments thereof, it is to be understood that various modifications may be resorted to as described above, without departing from the spirit and scope of the present invention, and the appended claims are to be construed to cover any such modifications as fall within the true spirit and scope thereof. For example, the present invention is applicable to any detectors of a physical quantity utilizing the phase modulation method, by which the phase of an electrical signal is modulated in accordance with the variation of such quantity.

What is claimed is:

1. An apparatus for determining a physical quantity, comprising:
   first means for generating a first signal the phase of which is modulated corresponding to a variation of said physical quantity;
   second means for generating a second signal the phase of which follows that of said first signal;
   third means for generating a third signal corresponding to the time intervals during which differences in phase exist between the first and the second signal; and
   fourth means comprising storing means for storing said third signal in accumulation, said second means controlling, in response to said third signal, the degree by which the second signal follows the first signal.

2. An apparatus as claimed in claim 1, wherein said first means comprises a resolver.

3. An apparatus as claimed in claim 1, wherein said fourth means comprises read-out means for reading out the content of said storing means at selected times.

4. An apparatus as claimed in claim 3, wherein said read-out means comprises computer means for reading out the content of said storing means at predetermined sampling times.

5. An apparatus as claimed in claim 4, wherein said read-out means further comprises a measurement circuit means for storing the value in said storing means corresponding to a measurement command signal, said computer means reading out the value stored in the measurement circuit means at a suitable time.

6. An apparatus as claimed in claim 1, wherein the first means comprises means for outputting a sinusoidal wave as the phase-modulated first signal and means for shaping the wave-form of said sinusoidal wave.

7. An apparatus as claimed in claim 6, wherein said second means comprises gate means for gating the third signal supplied thereto from said third means, and follower counter means for counting the output signal supplied from said gate means.

8. An apparatus as claimed in claim 7, wherein said third means comprises logical comparing means for logically comparing the wave-form-shaped first signal with a rectangular pulse output from said follower counter means.

9. An apparatus as claimed in claim 7, wherein said means for generating said sinusoidal wave comprises means for generating a clock signal, and a reference counter for counting the clock signal supplied from said clock signal generating means.

10. An apparatus as claimed in claim 9, wherein said clock signal generating means comprises means for generating a plurality of clock signals.

11. An apparatus as claimed in claim 10, wherein said second means comprises a follower counter having a counting range equal to that of said reference counter.

12. An apparatus as claimed in claim 11, wherein the gate means in said second means comprises a first and a second adjustment gate into which two kinds of a plurality of clock signals having mutually distinct phases are supplied from said clock signal generating means respectively, said follower counting means comprising means for effecting counting corresponding to the outputs supplied thereto from said adjustment gates.

13. An apparatus as claimed in claim 12, wherein the third signal is outputted from said third means in response to the state of increase and decrease in the amount of phase modulation in the first signal, said third signal being inputted into said first and second adjustment gates.

14. An apparatus as claimed in claim 9, wherein said second means comprises a follower counter having a counting range equal to that of said reference counter.

15. An apparatus as claimed in claim 14, wherein the storing means in said fourth means comprises a counter having a counting range greater than that of said reference counter.

16. An apparatus as claimed in claim 6, wherein said means for generating said sinusoidal wave comprises means for generating a clock signal, and a reference counter for counting the clock signal supplied from said clock signal generating means.

17. An apparatus as claimed in claim 16, wherein said clock signal generating means comprises means for generating a plurality of clock signals.

18. An apparatus as claimed in claim 17, wherein said second means comprises a follower counter having a counting range equal to that of said reference counter.

19. An apparatus as claimed in claim 16, wherein said second means comprises a follower counter having a counting range equal to that of said reference counter.

20. An apparatus as claimed in claim 19, wherein the storing means in said fourth means comprises a counter having a counting range greater than that of said reference counter.

21. An apparatus as claimed in claim 19 wherein said second means comprises gate means for gating the third signal supplied thereto from said third means, and follower counter means for counting the output signal supplied from said gate means, said gate means in said second means comprising a first and a second adjustment gate into which two kinds of a plurality of clock signals having mutually distinct phases are supplied from said clock signal generating means, respectively, said follower counting means comprising means for effecting counting corresponding to the outputs supplied thereto from said adjustment gates.

22. An apparatus as claimed in claim 21, wherein the third signal is outputted from said third means in response to the state of increase and decrease in the amount of phase modulation in the first signal, said third signal being inputted into said first and second adjustment gates.

23. An apparatus as claimed in claim 7 wherein the gate means in said second means comprises a first and a second adjustment gate into which two kinds of a plurality of clock signals having mutually distinct phases are supplied from said clock signal generating means respectively, said follower counting means comprising means for effecting counting corresponding to the outputs supplied thereto from said adjustment gates.

24. An apparatus as claimed in claim 23, wherein the third signal is outputted from said third means in response to the state of increase and decrease in the amount of phase modulation in the first signal, said third signal being inputted into said first and second adjustment gates.

25. An apparatus for determining a physical quantity, comprising:
   first means for generating a first signal the phase of which is modulated corresponding to a variation in said physical quantity;
   second means for generating a second signal the phase of which follows that of said first signal;

third means for generating a third signal corresponding to time intervals during which a difference in phases exists between said first and second signal;

fourth means for storing said third signal in accumulation and for generating a fourth signal at substantially equal time intervals on the basis of a accumulated value, during a time period which is determined in reference to the period of said first signal; and fifth means for storing a value corresponding to said fourth signal, the degree by which said second signal follows the first signal being controlled by said second means in response to the fourth signal supplied from said fourth means.

26. An apparatus as claimed in claim 25, wherein the first means comprises wave-form shaping means for shaping a modulated signal into the first signal having the form of a rectangular wave.

27. An apparatus as claimed in claim 25, wherein the first means further comprises clock signal generating means for generating a first clock signal utilized in said first means.

28. An apparatus as claimed in claim 27, wherein said clock signal generating means comprises means for generating a second clock signal supplied to the second, the fourth, and the fifth means.

29. An apparatus as claimed in claim 28, wherein said first and the second clock signals are in anti-phase.

30. An apparatus as claimed in claim 27, wherein the first means comprises reference counter means for dividing the frequency of the first clock signal.

31. An apparatus as claimed in claim 25, wherein said third means comprises comparing means for logically comparing the first and the second signal having rectangular wave-forms.

32. An apparatus as claimed in claim 25, wherein said fourth means comprises a speed counter means for effecting counting in response to said third signal, and prediction signal generating means for generating a prediction signal the frequency of which corresponds to a value stored in said speed counter means.

33. An apparatus as claimed in claim 32, wherein said fourth means comprises means for supplying an absolute value of a value stored in said speed counter means to said prediction signal generating means.

34. An apparatus as claimed in claim 32, wherein said prediction signal generating means returns to an initial state thereof in response to an output from said follower counter.

35. An apparatus as claimed in claim 34, wherein said prediction signal generating means generates at substantially equal spacings a number of prediction signals corresponding to a value stored in said speed counter during a half or whole period of said second signal.

36. An apparatus as claimed in claim 32, wherein said prediction signal generating means comprises a clock pulse counter means for counting and outputting the number of a second clock signal, and a logical circuit means connected to said speed counter means and said clock pulse counter means for effecting a logical operation on a value stored in said speed counter means and said number outputted from the clock pulse counter signal generating means, thereby generating substantially equally spaced pulses the number of which corresponds to the value stored in said speed counter means.

37. An apparatus as claimed in claim 36, wherein said fourth means further comprises binary means for outputting a signal representing a value stored in said speed counter means in the form of a corresponding binary number.

38. An apparatus as claimed in claim 37, wherein said clock pulse counter means comprises binary counter means for counting the number of said clock signals in the binary representation.

39. An apparatus as claimed in claim 38, wherein said binary counter means comprises a plurality of flip-flops.

40. An apparatus as claimed in claim 38, wherein said logical circuit means comprises logical product means for effecting a logical product operation on a number counted by the binary counting means, the clock signal, and an output of said binary means representing the value stored in the speed counter means in the form of a binary number, and logical addition means connected to said logical product means for effecting logical addition on the outputs of said logical product means.

41. An apparatus as claimed in claim 36, wherein said speed counter means comprises a reversible counter means for storing a positive and a negative value therein corresponding to a sign of said third signal, said reversible counter means comprising means for outputting a direction signal corresponding to the sign of the value stored therein, said fourth means further comprising a direction judgement circuit means connected to said reversible counter means, for generating pulses corresponding to said pulses outputted from said logical circuit means, from different output terminals corresponding to a difference of a value of said direction signal.

42. An apparatus as claimed in claim 36, wherein said clock pulse counter means comprises a modulo 500 counter.

43. An apparatus as claimed in claim 36 wherein said clock pulse counter means comprises a modulo 512 counter comprising mutually connected binary counters.

44. An apparatus as claimed in claim 25, wherein said second means comprises gate means for gating said fourth signal supplied thereto, and follower counting means for counting a signal supplied thereto from said gate means.

45. An apparatus as claimed in claim 44, wherein said gate means comprises first adjustment gate means for supplying a first counting signal which advances the phase of the output signal of said follower counting means, and second adjustment gate means for supplying a second counting signal which retards the phase of the output signal of said follower counting means.

46. An apparatus as claimed in claim 44, wherein the counting range of said follower counting means coincides with that of said reference counter provided in the first means.

47. An apparatus as claimed in claim 46, wherein said storing means in said fifth means comprises a counter having a counting range greater than that of said reference counter.

48. An apparatus as claimed in claim 25, wherein the storing means in said fifth means comprises a storing counter, said fifth means further comprising read-out means for reading out a value stored in said storing counter.

49. An apparaus as claimed in claim 48, wherein said read-out means comprises a computer means for reading out the value stored in said counter at a fixed sampling period.

50. An apparatus as claimed in claim 48, wherein said read-out means comprises measurement means for reading out the value in said storing counter in response to a measurement command signal generated at an arbitrary time.

51. An apparatus as claimed in claim 50, wherein said fifth means comprises computer means for reading out the value stored in said storing counter at a fixed sampling period, said computer means comprising means for reading out the value read out by said measurement circuit at a predetermined timing in response to a measurement command signal.

52. An apparatus as claimed in claim 25, wherein said third signal is inputted into said fifth means.

53. An apparatus as claimed in claim 52, wherein said third signal is inputted into said second means.

54. An apparatus as claimed in any one of the claims 16 through 44, wherein said first means comprises a resolver.

55. An apparatus as claimed in claim 53, wherein said third means comprises logical comparing means for supplying a prohibition command signal to the fifth means which prohibits the generation of the fourth signal from the fourth means when the third signal is generated.

56. An apparatus as claimed in claim 25, wherein said third signal is inputted into said second means.

* * * * *